(12) United States Patent
Sato et al.

(10) Patent No.: US 8,217,672 B2
(45) Date of Patent: Jul. 10, 2012

(54) TEST APPARATUS, TEST METHOD, AND MANUFACTURING METHOD

(75) Inventors: Kazuhiro Sato, Yokohama (JP); Manabu Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 363 days.

(21) Appl. No.: 12/469,857

(22) Filed: May 21, 2009

(65) Prior Publication Data

US 2009/0224778 A1    Sep. 10, 2009

Related U.S. Application Data

(63) Continuation of application No. PCT/JP2007/057199, filed on Mar. 30, 2007.

(30) Foreign Application Priority Data

Nov. 30, 2006  (JP) .................................. 2006-322947

(51) Int. Cl.
*G01R 31/312* (2006.01)
(52) U.S. Cl. ............................... 324/750.17; 324/754.28
(58) Field of Classification Search .. 324/762.01–762.1, 324/750.01–750.3; 340/10.1–10.3, 12.5–12.51, 340/13.25–13.26, 572.1–572.4
See application file for complete search history.

(56) References Cited

U.S. PATENT DOCUMENTS

| | | | |
|---|---|---|---|
| 7,225,992 B2 * | 6/2007 | Forster | 235/492 |
| 7,306,162 B2 | 12/2007 | Forster | |
| 2004/0253818 A1 | 12/2004 | Okamoto et al. | |
| 2005/0223286 A1 | 10/2005 | Forster | |
| 2006/0012387 A1 * | 1/2006 | Shanks | 324/750 |
| 2006/0220859 A1 | 10/2006 | Nagai et al. | |
| 2007/0290855 A1 | 12/2007 | Nagino et al. | |

FOREIGN PATENT DOCUMENTS

| | | |
|---|---|---|
| EP | 1602093 B1 | 12/2005 |
| EP | 1990784 A1 | 11/2008 |
| EP | 2264678 A1 | 12/2010 |
| JP | 10-010173 A | 1/1998 |
| JP | 2004-220141 A | 8/2004 |

(Continued)

OTHER PUBLICATIONS

Notification of Transmittal of Translation of the International Preliminary Report on Patentability (Forms PCT/IB/338) of International Application No. PCT/JP2007/057199 mailed Jun. 11, 2009 with Forms PCT/IB/373 and PCT/ISA/237.
Taiwanese Office Action dated Oct. 6, 2009, issued in corresponding Taiwanese Patent Application No. 961113368.
International Search Report of PCT/JP2007/057199, Mailing Date of Aug. 21, 2007.

(Continued)

*Primary Examiner* — Jermele M Hollington
*Assistant Examiner* — Tung X Nguyen
(74) *Attorney, Agent, or Firm* — Westerman, Hattori, Daniels & Adrian, LLP

(57) ABSTRACT

An apparatus includes: a strip line cell 100 having a first conductor board that has the width larger than the width of RFID tag T1 that receives a predetermined radio wave signal and reacts, to which first conductor board an electric signal that corresponds to the radio wave signal is supplied from outside, and a second conductor board opposed to the first conductor board, wherein the RFID tag T1 is arranged on other side with the opposite side opposed to the second conductor board, of the first conductor board that transmits the radio wave signal with an output according to an electric power that the electric signal possesses; a reader writer 20 that supplies the electric signal to the first conductor board of the strip line cell 100; and a computer 30 that confirms presence of reaction in the RFID tag T1.

20 Claims, 34 Drawing Sheets

FOREIGN PATENT DOCUMENTS

| | | |
|---|---|---|
| JP | 2005-222206 A | 8/2005 |
| JP | 2006-064428 A | 3/2006 |
| TW | I255066 B | 5/2006 |
| WO | 2004/072892 A2 | 8/2004 |

OTHER PUBLICATIONS

Korean Office Action dated Sep. 30, 2011, issued in corresponding Korean Patent Appliation No. 10-2009-7011015.

* cited by examiner

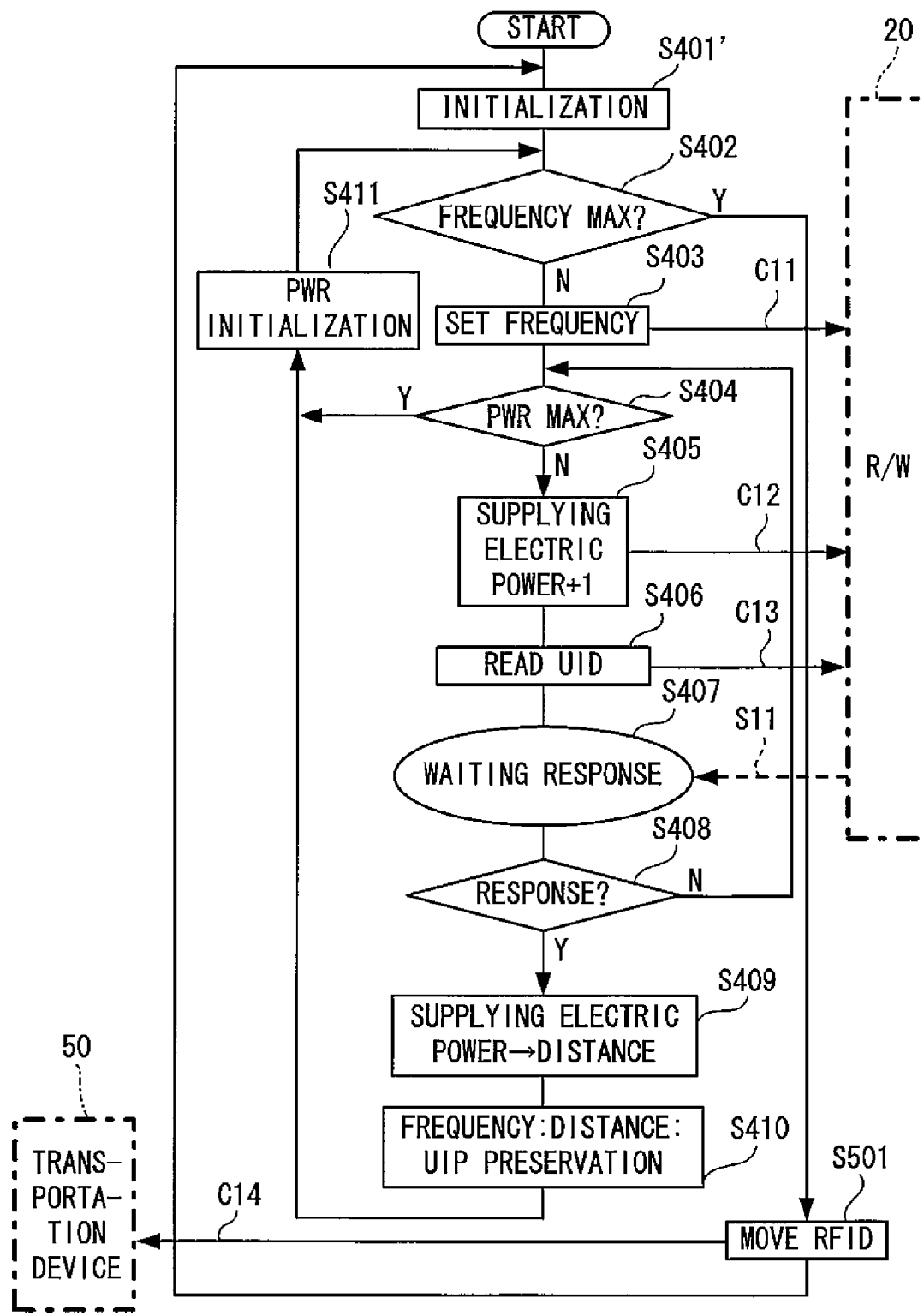

TEST APPARATUS, TEST METHOD, AND MANUFACTURING METHOD

TECHNICAL FIELD

The present invention relates to a test apparatus that examines the performance of the electronic device that operates in response to a predetermined radio wave signal, a test method of such a performance examination, and a manufacturing method of the electronic device that includes such a test method as a process.

BACKGROUND ART

Recently, RFID (Radio Frequency Identification: wireless automatic operation identification) tag of various types to exchange information by non-contact through the electric wave is paid to attention between external equipment, for example, the reader writer. As a kind of such RFID tag, there is proposed the one of the composition in which the antenna pattern and the integrated circuit chip for the electric wave communication are installed on the base seat that consists of plastic or paper. With respect to the use of such a type of RFID tag, there is considered a utility form in which it is put on an article and the like, and the article is identified by exchanging information on the article with external equipment. The system using the RFID tag is put to practical use in all fields of, for instance, agriculture, the fishery, manufacturing, distribution, service, the medical treatment, welfare, public, the administration, traffic, and transportation, or is examined.

When such RFID tag is developed and manufactured, the performance examination of the wireless communication performance that is one of the main performances of the RFID tag is done. Work of irradiating the electric wave from a predetermined antenna to the RFID tag to imitate the communication of the RFID tag is performed in such an examination so far. Here, when such work as mentioned above is done in the manufacturing premises of the RFID tag for instance, there is a possibility of occurrence of such inconvenience that electric wave, which is emitted from the antenna at the time of the test and traveled to the periphery of the examination area, has an effect on the operation of the peripheral equipment in the manufacturing premises, and it brings about erroneous irradiation to the RFID tag other than the examination object. Moreover, there is a possibility that the returning reflected wave, which is reflected on the traveling destination, interferes with the electric wave in the examination area, and thus an accurate examination cannot be done. In order to evade the situation like these so far, for instance, a special test atmosphere such as the RF anechoic chambers is needed in the examination that treats the electric wave. As a result, when the performance of the wireless communication performance is examined when the RFID tag is developed and manufactured, it is necessary to move the RFID tag to be examined to the RF anechoic chamber and the like, and this disturbs the development of the RFID tag and the efficiency improvement of manufacturing.

Moreover, to attempt the efficiency improvement of manufacturing even forcibly, it is carried out that the performance examination is executed on the line without moving the RFID tag now on manufacturing on the production line to the RF anechoic chamber and the like. However, in this case, or in the event that the RF anechoic chamber and the like cannot be prepared, the examination that suppresses the output of the electric wave from the antenna as much as possible is carried out to suppress the influence on the surrounding as much as possible. This is not enough as the performance examination.

Incidentally, the RFID tag installs a memory which stores information and the like exchanged with the outside by a wireless communication, and when the RFID tag is manufactured or the system constructs using the RFID tag, there are performed writing of information into the memory and confirmation of information in the memory. Writing and the confirmation of such information are performed by a wireless communication. There is proposed a technique (refer to Japanese Laid-open Patent Publication No. 2005-222206, for instance) in which while two or more RFID tags are transported along a predetermined transportation line, writing and the confirmation of information are sequentially carried out for each RFID tag, and the area where writing and the confirmation of information are performed is covered with a simple shield, so that the electric wave for the communication at the time when writing and confirming of information for a certain RFID tag are performed should not influence other RFID tag. If such a technique is applied to the above-mentioned performance examination, the examination of the communication performance becomes possible without using the RF anechoic chamber and the like to some extent.

However, according to the technique disclosed in Japanese Laid-open Patent Publication No. 2005-222206, there is needed the environment covered with the shield of a moderate size even though the simple shield that can be constructed on the production line for instance.

Though there is explained the problem on the performance examination of the communication performance of the RFID tag here, the problem as mentioned above might happen generally in the performance examination of the electronic device that operates in response to a predetermined radio wave signal, such as a circuit board to exchange the signal by the wireless for instance. As a reaction of such an electronic device, there are considered outputs of an radio wave signal and an electric signal, and beginning and termination of internal processing.

In view of the foregoing, it is an object of the present invention to provide a test apparatus that can easily perform an enough performance examination of the communication performance of an electronic device that receives a predetermined radio wave signal and reacts, a test method capable of such a performance examination, and a manufacturing method of the electronic device that includes such a test method as a process.

DISCLOSURE OF THE INVENTION

To achieve the above-mentioned object, the present invention provides a test apparatus includes:

a strip line cell that includes a first conductor board which has the width greater than the width of an electronic device receiving a predetermined radio wave signal to react, to which first conductor board an electric signal corresponding to the radio wave signal is supplied from outside, and a second conductor board being opposed to the first conductor board, wherein the electronic device is arranged on other side with respect to an opposite surface of the first conductor board, the opposite surface being opposed to the second conductor board, and that transmits the radio wave signal in an output according to an electric power which the electric signal has;

a supplying section that supplies the electric signal to the first conductor board of the strip line cell; and a reaction confirmation section that confirms whether or not there is a reaction in the electronic device.

The strip line cell is known as a device to obtain the TEM (Transverse Electromagnetic) wave that is an electric wave easy in handling on the computation so far. The strip line cell has a first conductor board to which an electric signal is supplied from the outside, and a second conductor board opposed to the first conductor board, and transmits the TEM wave with the output according to the electric power that the electric signal possesses in the space defined by both the first conductor board and the second conductor board. Though the communication performance of the electronic device can be examined by using this TEM wave, there is needed a space to arrange the electronic device of the examination object between the first conductor board and the second conductor board. As a result, the strip line cell known so far becomes big one which is not so different from one where a simple shield is installed in surroundings of the electronic device to be examined. Incidentally, a kind of leakage electric wave that is called a semi-TEM wave almost equal to the TEM wave is caused on other side with the opposite side opposed to the second conductor board, of the first conductor board that constitutes the strip line cell, that is, on the other side with the space where the TEM wave is caused. In addition, this semi-TEM wave attenuates rapidly while parting from the first conductor board, and spreads only in the area in the first conductor board neighborhood very limited. Here, the inventor finds that the semi-TEM wave is suitable for the examination of the communication performance of the electronic device such as the RFID tag for instance, and discovers that the transmission area which is a limited one of the semi-TEM wave is able to be used as an examination area. The present invention is the one performed based on this discovery. According to the test apparatus of the present invention, it is possible to examine the communication performance of the electronic device by using the semi-TEM wave. Therefore, there is no need for the strip line cell in the test apparatus of the present invention to provided between the first conductor board and the second conductor board a space that is necessary for the conventional strip line cell to arrange the examination object, and thus it is possible to contribute to reducing the thickness by bringing those the first conductor board and the second conductor board close by the amount of the space. In addition, it is possible to construct the strip line cell in such a way that the width of the first conductor board is typically almost the same width as the width of the electronic device to be examined, and it is possible to miniaturize it even to the almost same size as that of the electronic device to be examined. In addition, since the transmission area of the semi-TEM wave is limited, the radio wave signal might not spread to surroundings, and simple arrangement of the electronic device to be examined in the transmission area of the semi-TEM wave makes it possible to perform the examination without the use of the RF anechoic chamber to evade the influence on the surrounding and the use of even a simple shield etc. Moreover, because the radio wave signal might not spread to surroundings, the output of the radio wave signal need not be suppressed when examining it and an enough performance examination becomes possible. As mentioned above, according to the test apparatus of the present invention, it is possible to simply perform enough performance examination of the communication performance of the electronic device that receives a predetermined radio wave signal and reacts.

In the test apparatus according to the present invention, it is preferable that "the test apparatus further includes:

a conversion section that converts an electric power which the electric signal supplied to the strip line cell by the supplying section has into a distance between a predetermined antenna and the electronic device in a situation in which the predetermined antenna sends the radio wave signal in a predetermined output for the electronic device to receive, in accordance with a predetermined conversion relation."

Further, in the test apparatus according to the present invention, it is also preferable that "the supplying section sequentially supplies electric signals each having respective electric powers being different to one another to the strip line cell, and the reaction confirmation section confirms a reaction of the electronic device for each of the electric signals."

According to the test apparatus of the preferable forms as mentioned above, it is possible to implement operation of determining the communication limit distance of the electronic device by converting a minimum electric power from which the above-mentioned reaction is confirmed into the distance from the antenna.

Incidentally, it is acceptable that conversion according to the above-mentioned conversion relation converts the electric power into the distance in accordance with one conversion relation that associates the electric power with the distance immediately for instance. Or, it is acceptable to adopt such two stages of conversion that the electric power is once converted into the output of the radio wave signal in accordance with two conversion relations of a conversion relation that associates the electric power with the output of the radio wave signal transmitted from the strip line cell, and a conversion relation that associates the distance from the antenna with the output of the radio wave signal in the distance, and then the converted output is converted into the distance. Moreover, it is acceptable that the above-mentioned one conversion relation and two conversion relations are determined based on a well-known expression in the field of the electromagnetism, or alternatively be determined by a series of following measurement work. First of all, the output of the radio wave signal at individual distance from the antenna when the antenna transmits the radio wave signal by a predetermined output is measured in the RF anechoic chamber or the equivalent environment (Hereafter, it is referred to the RF anechoic chamber etc.). Next, there is measured the output of the radio wave signal to individual electric power where electric signals that have various electric powers are supplied to the strip line cell and the radio wave signals of various outputs are transmitted. Through such measurement work, there are obtained two conversion relations of the conversion relation that associates the distance from the antenna with the output of the radio wave signal, and the conversion relation that associates the electric power of the electric signal supplied to the strip line cell with the output of the radio wave signal. In addition, there is obtained one conversion relation for converting the electric power of the electric signal supplied to the strip line cell into the distance from the antenna by coupling these two conversion relations with one another so that electric power and distance, which are mutually equal in the output of the radio wave signal, are associated with one another.

In the test apparatus according to the present invention as mentioned above, it is preferable that "the supplying section sequentially supplies electric signals each having an electric power in a predetermined range of electric power to the strip line cell, the reaction confirmation section confirms a reaction of the electronic device to each of the electric signals, and the test apparatus further includes a transportation section that transports a plurality of the electronic devices to arrange sequentially the plurality of the devices for the strip line cell, and that arranges, in a case where one arranged electronic device reacts while the electric signals are sequentially supplied to the one arranged electronic device, or in a case where the electric signals are supplied until the last, one following electronic device."

According to the test apparatus as mentioned above, whenever the examination of one electron device ends, the following electron device is automatically transported to the examination position, so that two or more electronic devices can be efficiently examined.

In the test apparatus according to the present invention as mentioned above, it is preferable that "the strip line cell transmits the radio wave signal of same frequency as that of the electric signal, the supplying section performs a process to supply sequentially electric signals each having a mutually different electric power to the strip line cell for each frequency in a predetermined frequency range, and the reaction confirmation section confirms a reaction of the electronic device to each of the electric signals."

According to the test apparatus as mentioned above, it is possible to easily obtain the frequency characteristic of the electronic device, that is, the relation between individual frequency within the frequency range in the electronic device and the communication limit distance.

In the test apparatus according to the present invention as mentioned above, it is preferable that "the strip line cell transmits the radio wave signal of same frequency as that of the electric signal, the supplying section performs a process to supply sequentially electric signals each having an electric power in a predetermined electric power range to the strip line cell for each frequency in a predetermined frequency range, the reaction confirmation section confirms a reaction of the electronic device to each of the electric signals, and the test apparatus further includes a transportation section that transports a plurality of the electronic devices to arrange sequentially the plurality of electronic devices for the strip line cell, and arranges, in a case where the process to supply each of the electronic signals is performed for one arranged electronic device until the last frequency of the frequency range, one following electronic device."

According to the test apparatus as mentioned above, it is possible to automatically obtain the frequency characteristics of two or more electronic devices.

In the test apparatus according to the present invention as mentioned above, it is preferable that "the test apparatus has a plurality of the strip line cells for each of which the electronic device is arranged, and the supplying section supplies the electric signals to the plurality of the strip line cells in mutually different timings, respectively."

According to the test apparatus as mentioned above, two or more electronic devices arranged for two or more strip line cells are examined in timings which shift mutually on a microscopic basis, but are examined comprehensively on a simultaneous parallel basis for a user, and thus it is efficient.

In the test apparatus according to the present invention as mentioned above, it is preferable that "the test apparatus has a plurality of sets each including of a plurality of the strip line cells for each of which the electronic device is arranged, and the supplying section has a plurality of suppliers each associated with the plurality of sets, respectively, and each of the plurality of suppliers supplies the electric signal to each of the plurality of the strip line cells composing each of the plurality of sets in respective timings being different to one another."

According to the test apparatus as mentioned above, the supplying machines are operated on a simultaneous parallel basis, and thus it is possible to efficiently examine a large amount of strip line cell that consists of two or more sets.

In the test apparatus according to the present invention as mentioned above, it is preferable that "the electronic device outputs identification information identifying oneself from other electronic devices when the electronic device receives a first radio wave signal, and performs the reaction to be confirmed by the reaction confirmation section when the electronic device receives a second radio wave signal containing the identification information of the oneself, the test apparatus further includes:

two of the strip line cells, the two of the strip line cells being disposed in a predetermined interval, for each of which two of the strip line cells the electronic device is arranged;

an identification information obtaining section that obtains the identification information which the electronic device outputs, and a transportation section that transports the electronic device by the predetermined interval along an arrangement of the two of the strip line cells to arrange the electronic device sequentially for the two of the strip line cells, and the supplying section supplies a first electric signal corresponding to the first radio wave signal to a first strip line cell for which the electronic device is first arranged of the two of the strip line cells, and supplies a second electric signal corresponding to the second radio wave signal containing the identification information obtained by the identification information obtaining section about the first radio wave signal, to a second strip line cell for which the electronic device is later arranged of the two of the strip line cells, in a timing when the electronic device identified by the identification information is arranged for the second strip line cell."

According to the test apparatus as mentioned above, the identification information of a certain electronic device is first obtained, and the performance examination that specifies the electronic device based on the identification information becomes possible. As a result, it is possible to evade such a trouble that other electron devices that exist near the electronic device examining the performance react by mistake for instance, and thus it is possible to perform an examination with greater accuracy.

In the test apparatus according to the present invention as mentioned above, it is preferable that "the transportation section performs transportation, instead of the transportation by the predetermined interval, by an interval corresponding to one an integral submultiple of the predetermined interval, to arrange the electronic devices are sequentially for the two of the strip line cells, the identification information obtaining section has a FIFO memory which stores, by First-In First-Out method, information of the same number as a number of times of the transportation for moving the electronic device from one to other of the two strip line cells by the transportation section, and stores the identification information output from the electronic device in the FIFO memory whenever the supplying section supplies the first electric signal to the first strip line cell, and the supplying section sequentially repeats supplying of the first electric signal, obtaining the information from the FIFO memory, and supplying of the second electric signal based on the obtained information."

According to the test apparatus as mentioned above, it is possible to flexibly cope with various size of electronic device because it is possible to adjust the transportation interval of the electronic device, which becomes 1/N where N=integer, of an arrangement interval of two strip line cells, in accordance with the size of the electronic device within the range until the arrangement interval for instance.

In the test apparatus according to the present invention as mentioned above, it is preferable that "the electronic device outputs identification information identifying oneself from the other electronic devices when the electronic device receives a first radio wave signal, and performs the reaction to be confirmed by the reaction confirmation section when the electronic device receives a second radio wave signal containing the identification information of the electronic device itself, the test apparatus further includes:

two of the strip line cells, for each of which two of the strip line cells the electronic device is arranged; and an identification information obtaining section that obtains identification information which the electronic device outputs, a transportation section that arranges the electronic device to each of the two of the strip line cells, and an attenuation section that attenuates at a predetermined level the electric signal to be supplied to a first strip line cell which is one of the two of the strip line cells, and transfers the attenuated electric signal to a second strip line cell which is another of the two of the strip line cells, and the supplying section supplies a first electric signal corresponding to the first radio wave signal to the first strip line cell, and supplies a second electric signal corresponding to the second radio wave signal containing the identification information obtained by the identification information obtaining section through the first strip line cell and the attenuation section to a second strip line cell."

According to the test apparatus as mentioned above, when an electric signal is supplied to the first strip line cell, the electric signal is attenuated by the attenuation section and transmitted to the second strip line cell too. Therefore, as to the use of the first strip line cell and the second strip line cell, it is possible to use these electric signals properly without switching the supply destination of these electric signals by using the first electric signal with weakening it to such an extent that the electronic device arranged on the second strip line cell doesn't react, and using the second electric signal with strengthening it to such an extent that the electronic device arranged on the second strip line cell reacts, too.

In the test apparatus according to the present invention as mentioned above, it is preferable that "a transmission section that is interposed between the supplying section and the strip line cell, that converts an electric power of the electric signal which the supplying section supplies into an electric power according to a predetermined operation, and that transmits the electric signal after the electric power conversion to the strip line cell."

According to the test apparatus as mentioned above, it is possible to examine it easily by the user's operation to the transmission section as to confirming the presence of the response of the electronic device for instance about the radio wave signal of various outputs, without need of the program for the examination.

In the test apparatus according to the present invention as mentioned above, it is preferable that "the transmission section has a plurality of scales representing a mutually different distances, the plurality of scales each representing of a distance between a predetermined antenna and the electronic device in a situation where the predetermined antenna transmits the radio wave signal in a predetermined output to be received by the electronic device, and when a predetermined operator is set to either one of the plurality of scales, converts the electric power of the electric signal which the supplying section supplies, in the situation, into an electric power necessary for the strip line cell to transmit the radio wave signal of an output equal with the output of the radio wave signal in the distance represented by the set scale."

According to the test apparatus as mentioned above, it is possible to examine it easily by the user's operation to the transmission section as to the examination in which the communication limit distance of the electronic device is determined for instance, without need of the program for the examination etc.

In the test apparatus according to the present invention as mentioned above, it is preferable that "the test apparatus has two of the strip line cells, the transmission section transmits the electric signal to a first strip line cell which is one of the two of the strip line cells, and the test apparatus further includes a second transmission section that attenuates the electric signal transmitted to the first strip line cell to a level according to a predetermined operation, and transmits the attenuated electric signal to a second strip line cell which is another of the two of the strip line cells."

According to the test apparatus as mentioned above, for instance, it is possible to efficiently perform the following examinations. When the performance needed for the electronic device is to react to the radio wave signal within a certain range of the output, the transmission section and the second transmission section are operated so that the first strip line cell sends the radio wave signal of greatest strength in the range of the output, the second strip line sends the radio wave signal of minimum strength, and the electronic devices are sequentially arranged to the strip line cells. Thus, it is possible to easily perform a confirmation as to whether the electronic device has the performance as mentioned above.

In the test apparatus according to the present invention as mentioned above, it is preferable that "the strip line cell is a strip line cell in which a distance between the first conductor board and the second conductor board is of $1/5$ or less of the width of the first conductor board."

The characteristic impedance that the strip line cell possesses is decided depending on the ratio of the interval between the first conductor board and the second conductor board to the width of the first conductor boards. Here, many of devices on the market that can be used as the supplying section have 50 ohms as output impedance. In order to simply provide impedance matching with such a device, it is necessary to adjust the characteristic impedance of the strip line cell to 50 ohms. To implement the characteristic impedance of 50 ohms, the interval between the first conductor board and the second conductor board should be made a thin structure of $1/5$ of the width of the first conductor board. In a strip line cell so far for the purpose of obtaining the TEM wave, it is necessary to provide a space where the object that receives the TEM wave is arranged as well as a space that transmits the TEM wave between the first conductor board and the second conductor board, but it is impossible to implement such a thin structure. To the contrary, according to the strip line cell of the test apparatus of the present invention, there is no need to provide such a space, and thus it is possible to contribute to impedance matching and miniaturization through implementing such a thin structure that the interval between the first conductor board and the second conductor board is $1/5$ of the width of the first conductor board, and it is also possible to contribute to further reducing the thickness.

In the test apparatus according to the present invention as mentioned above, it is preferable that "the strip line cell is a strip line cell which has, as the first conductor board, a conductor board with a half or less length of a wavelength of the radio wave signal".

According to the strip line cell of the test apparatus of the present invention, the semi-TEM wave that leaks within the range limited as mentioned above is used. This range becomes a range below half wavelength of the electric wave for the traveling direction of advanced electric wave toward the direction of length of the first conductor board. Then, as for substantially necessary length as length of the first conductor board, it is sufficient below the half wavelength, and thus it is possible to contribute to a miniaturization.

In the test apparatus according to the present invention as mentioned above, it is preferable that "the strip line cell has a putting board that is shaped as a board where the radio wave signal penetrates, in which the electronic device is put on one surface of front and back surfaces of the putting board, and other surface with respect to the one surface comes in contact with the first conductor board."

According to the test apparatus as mentioned above, the interval between the first conductor board and the electronic device is kept with the putting board at regular intervals, and thus it is possible to examine it stably.

In the test apparatus according to the present invention as mentioned above, it is preferable that "the strip line cell has a cover section that covers other side with respect to the opposite surface of the first conductor board excluding a predetermined area to limit an amount and a direction of the electric wave transmitted from the first conductor board to a predetermined amount and a predetermined direction, respectively."

According to the test apparatus as mentioned above, it is possible to strictly set the range and the direction where the semi-TEM wave leaks from the strip line cell.

To achieve the above-mentioned object, the present invention provides a test method includes the steps of:

supplying an electric signal to a first conductor board of a strip line cell that includes a first conductor board which has the width greater than the width of an electronic device receiving a predetermined radio wave signal to react, to which first conductor board an electric signal corresponding to the radio wave signal is supplied from outside, and a second conductor board being opposed to the first conductor board, wherein the electronic device is arranged on other side with respect to an opposite surface of the first conductor board, the opposite surface being opposed to the second conductor board, and that transmits the radio wave signal in an output according to an electric power which the electric signal has; and confirming whether or not there is a reaction in the electronic device.

According to the test method as mentioned above, it is possible to easily perform an enough performance examination of the communication performance of the electronic device that receives a predetermined radio wave signal and reacts.

To achieve the above-mentioned object, the present invention provides a manufacturing method includes the steps of:

creating an electronic device that receives a predetermined radio wave signal to react; and testing including the steps of:

supplying an electric signal to a first conductor board of a strip line cell that includes a first conductor board which has the width greater than the width of an electronic device, to which first conductor board an electric signal corresponding to the radio wave signal is supplied from outside, and a second conductor board being opposed to the first conductor board, wherein the electronic device is arranged on other side with respect to an opposite surface of the first conductor board, the opposite surface being opposed to the second conductor board, and that transmits the radio wave signal in an output according to an electric power which the electric signal has; and confirming whether or not there is a reaction in the electronic device.

According to the manufacturing method as mentioned above, it is possible to manufacture the electronic device that receives a predetermined radio wave signal and reacts by the manufacture method into which the test method of easily performing an enough performance examination of the communication performance is incorporated as a process.

Incidentally, as to the test method and the manufacturing method of the present invention, there are described only their basic forms, respectively. The purpose of this is to avoid overlapping, and the test method and the manufacturing method of the present invention include various forms corresponding to individual forms of the test apparatus as mentioned above as well as the basic forms as mentioned above.

As mentioned above, according to the present invention, it is possible to obtain a test apparatus that can easily perform an enough performance examination of the communication performance of an electronic device that receives a predetermined radio wave signal and reacts, a test method capable of such a performance examination, and a manufacturing method of the electronic device that includes such a test method as a process.

BRIEF DESCRIPTION OF THE DRAWINGS

FIG. 36 is a flowchart useful for understanding a flow of the frequency characteristics acquisition processing to be executed with the RFID tag test apparatus 9.

BEST MODE FOR CARRYING OUT THE INVENTION

Hereinafter there will be explained embodiments of the present invention in conjunction with the drawings.

First, there will be explained a first embodiment of the present invention.

Figure 1:
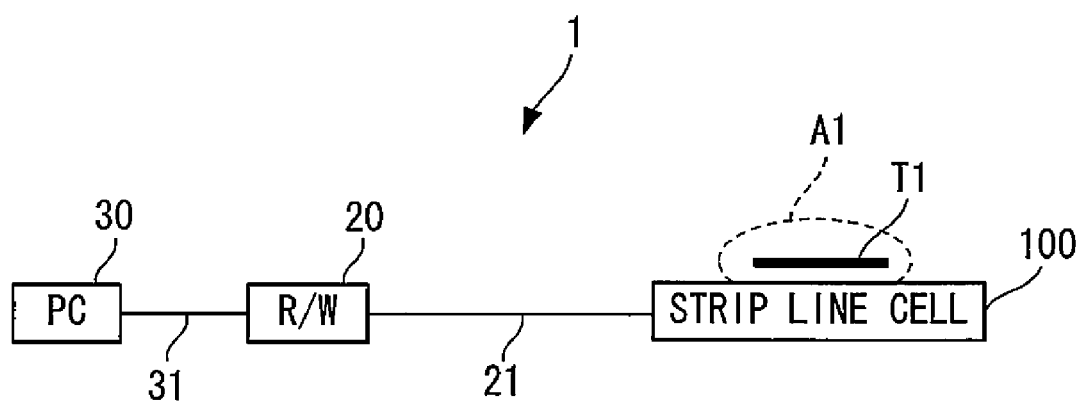
FIG. 1 is a view useful for understanding an RFID tag test apparatus according to a first embodiment of the present invention.

FIG. 1 is a view useful for understanding an RFID tag test apparatus according to a first embodiment of the present invention.

An RFID tag test apparatus 1, which is illustrated in FIG. 1, performs the performance examination on the communication performance of RFID tag T1 in which an antenna pattern for the electric wave communication and an integrated circuit chip are installed, and when a predetermined radio wave signal is received, a response signal is replied. The RFID tag test apparatus 1 is provided with a strip line cell 100, a reader writer 20, and a computer 30. The reader writer 20 is connected via a first cable 31 to the computer 30. The strip line cell 100 is connected via a second cable 21 to the reader writer 20. The RFID tag T1 corresponds to one example of the electronic device referred to in the present invention. The strip line cell 100 corresponds to one example of the strip line cell referred to in the present invention. The reader writer 20 corresponds to one example of the supplying section referred to in the present invention. The computer 30 corresponds to one example of the reaction confirmation section referred to in the present invention.

When the strip line cell 100 receives from the reader writer 20 through the second cable 21 an electric signal that corresponds to the above-mentioned radio wave signal, the strip line cell 100 sends the radio wave signal to a predetermined transmission area A1 with the output according to the electric power that the electric signal possesses. According to the present embodiment, the RFID tag T1 to be examined is put on the transmission area A1 on the strip line cell 100. When the RFID tag T1 receives the radio wave signal and transmits a response signal, the strip line cell 100 receives the response signal. The received response signal is sent to the reader writer 20 through the second cable 21.

The reader writer 20 receives from the computer 30 the instruction to supply an electric signal having a certain electric power to the strip line cell 100 and supplies the electric signal to the strip line cell 100. When the reader writer 20 receives the response signal from the strip line cell 100, the reader writer 20 notifies the computer 30 so.

The computer 30 directs the above-mentioned instruction to the reader writer 20 in accordance with a predetermined process while sequentially changing the electric power. This process will be described later.

The RFID tag test apparatus 1 is being composed by outline.

Next, it explains details of strip line cell 100 illustrated in one block in FIG. 1.

Figure 2:
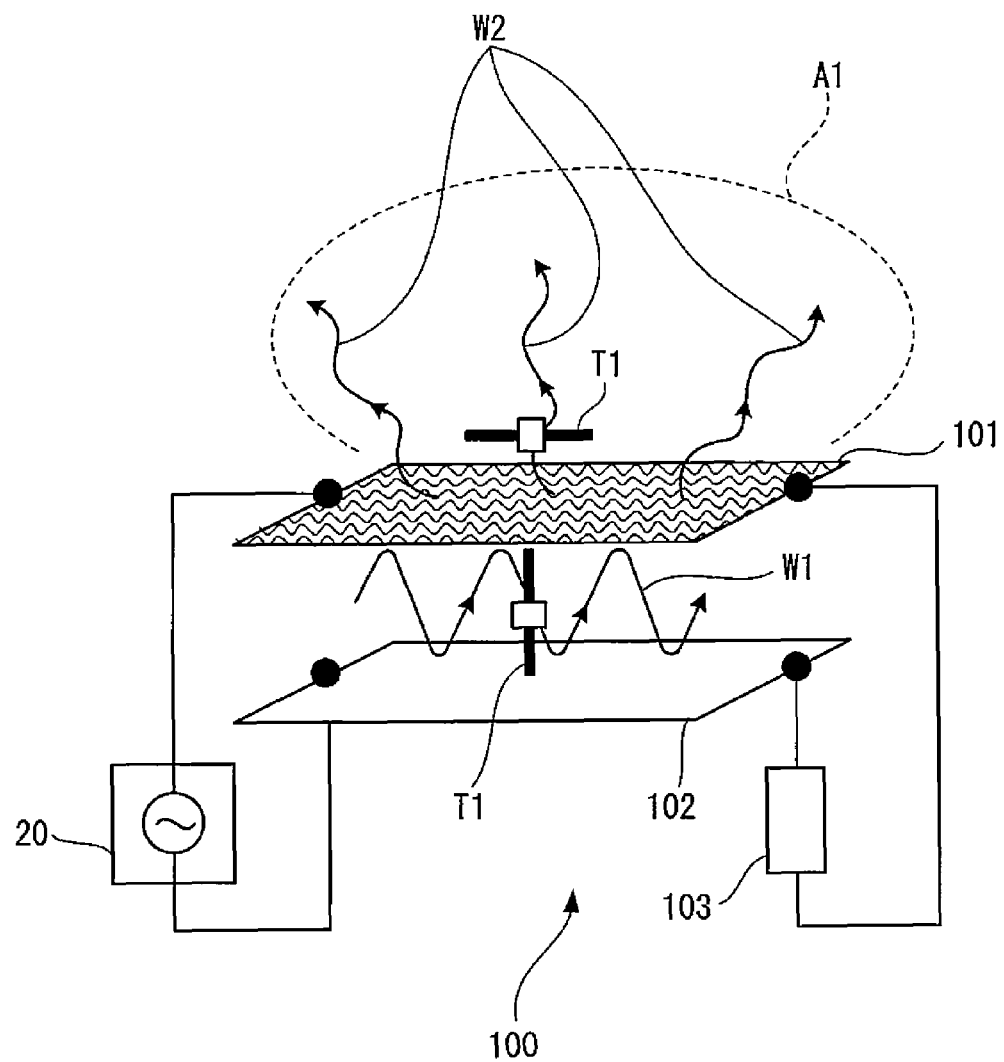
FIG. 2 is a typical illustration of a strip line cell 100.

FIG. 2 is a typical illustration of the strip line cell 100.

The strip line cell 100 is provided with a first conductor board 101 to which an electric signal is supplied from the reader writer 20, and a second conductor board 102 that opposes the first conductor board 101 and acts as a ground. An electric signal from the reader writer 20 is supplied to one end of the first conductor board 101, and the other end of the first conductor board 101 is connected with terminator resistance 103. According to the present embodiment, the resistance of the terminator resistance 103 is 50 ohms. The reason why this is to do so is that the characteristic impedance of the strip line cell 100 is designed to be 50 ohms as will be described later.

When an alternating current signal of a predetermined frequency is supplied to the first conductor board 101 as the above-mentioned electric signal, there is transmitted in the space between the first conductor board 101 and the second conductor board 102 a TEM wave W1 which travels from the supply side of the electric signal to the side of the terminator resistance 103, the TEM wave W1 having the electric field component and the magnetic field component in the direction perpendicular to the traveling direction. The TEM wave W1 is widely used for the examination of the communication performance and the like far for the reasons such as handling in the computation is easy. If the TEM wave W1 is used in the examination that uses the strip line cell 100, there is needed between the first conductor board 101 and the second conductor board 102 a space to arrange the RFID tag T1 to be examined in the parallel to the electric field component and the magnetic field component, that is, lengthwise in FIG. 2. To the contrary, according to the present embodiment, there is used a semi-TEM wave W2 almost equal to the TEM wave that leaks from the first conductor board 101 to the opposite side to the space where the TEM wave W1 is transmitted. Therefore, according to the present embodiment, there is no need of the above-mentioned space between the first conductor board 101 and the second conductor board 102, and thereby contributing to reducing the thickness as will be described later. The semi-TEM wave W2 almost travels in the direction of the normal for the first conductor board 101. Therefore, to receive the semi-TEM wave W2 with the RFID tag T1 to be examined, the direction of an arrangement of the RFID tag T1 becomes transverse in FIG. 2. Therefore, because the examination becomes possible only by putting the RFID tag T1 to be examined on the strip line cell 100 which contributes to reducing the thickness, operation is easy. Moreover, because the semi-TEM wave W2 used when examining it in the present embodiment attenuates rapidly while leaving from the first conductor board 101 as described later, the transmission area A1 is limited as indicated in FIG. 2. According to the present embodiment, the transmission area A1 is used as an examination area, and the RFID tag T1 to be examined is arranged in the transmission area A1. Therefore, according to the present embodiment, it is possible to evade such as situations that the electric wave when examining has an effect on a periphery of the examination area, and the returning reflected wave, which is reflected on the traveling destination, interferes with the electric wave in the examination area.

Next, it explains a concrete structure of the strip line cell 100.

Figure 3:
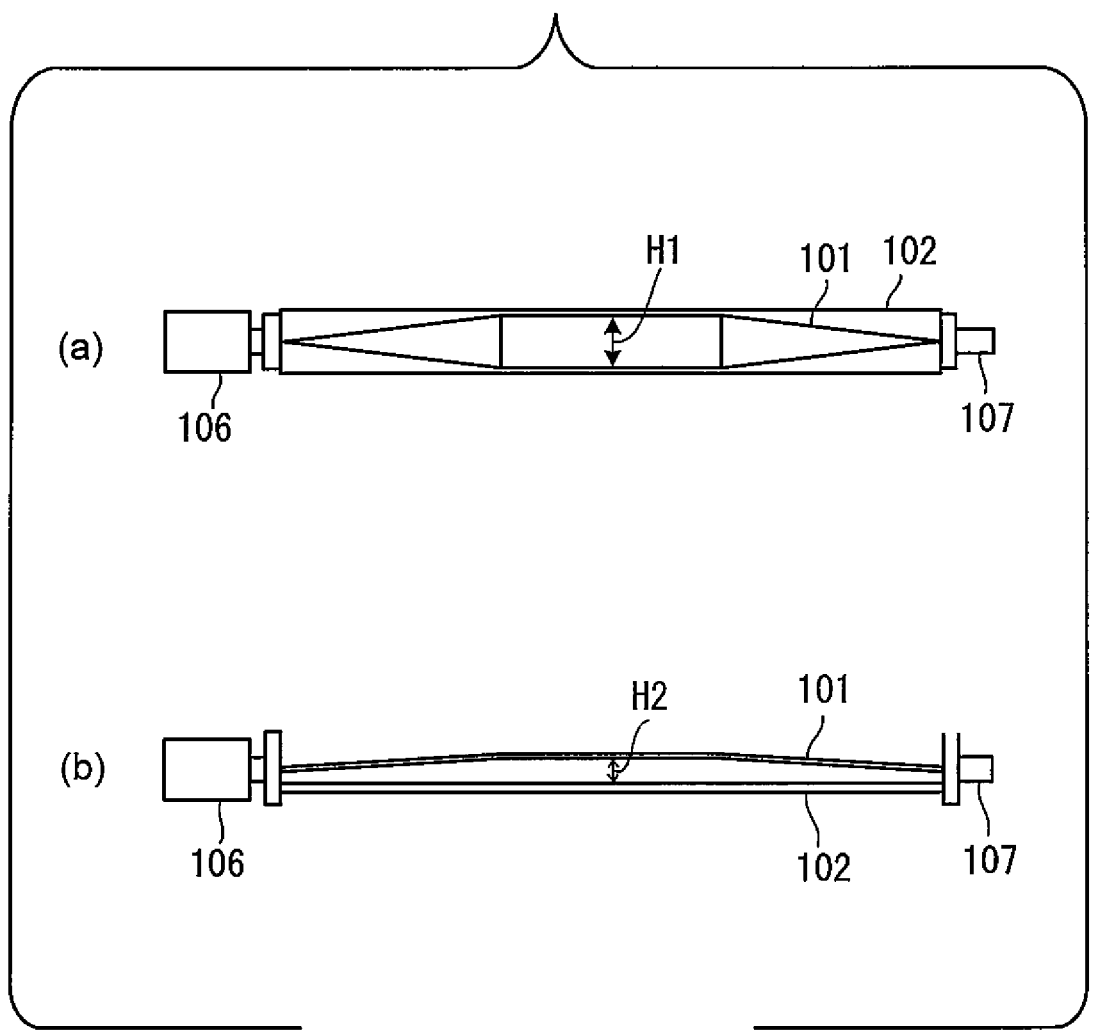
FIG. 3 is a view illustrating a first conductor board 101 and a second conductor board 102 on the strip line cell 100.
Figure 4:
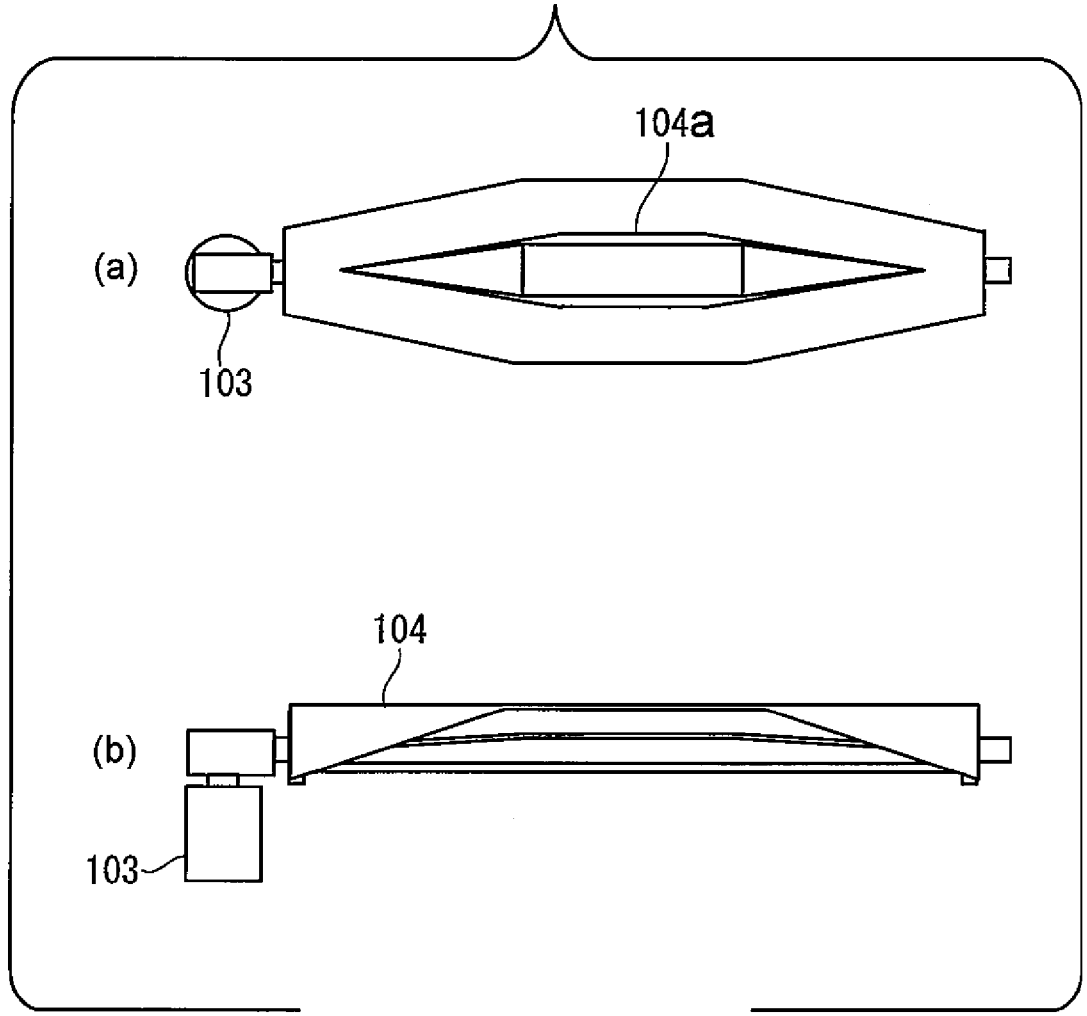
FIG. 4 is a view illustrating a state that a terminator resistance 103 is connected, and the first conductor board 101 and the second conductor board 102 are covered with a masking shield 104.
Figure 5:
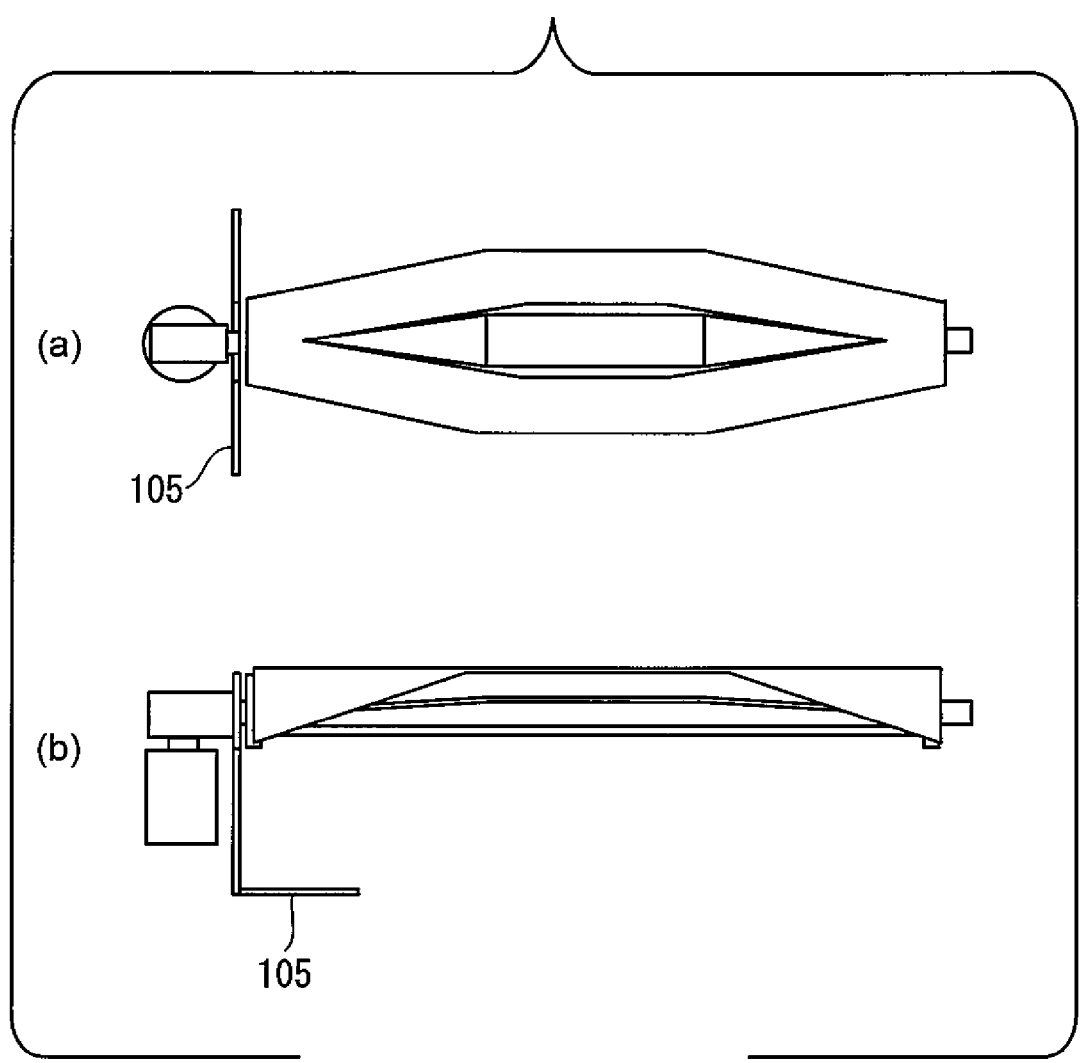
FIG. 5 is a view illustrating a state that a metal 105 for fixing a case of the strip line cell 100 is installed in the state of FIG. 4.
Figure 6:
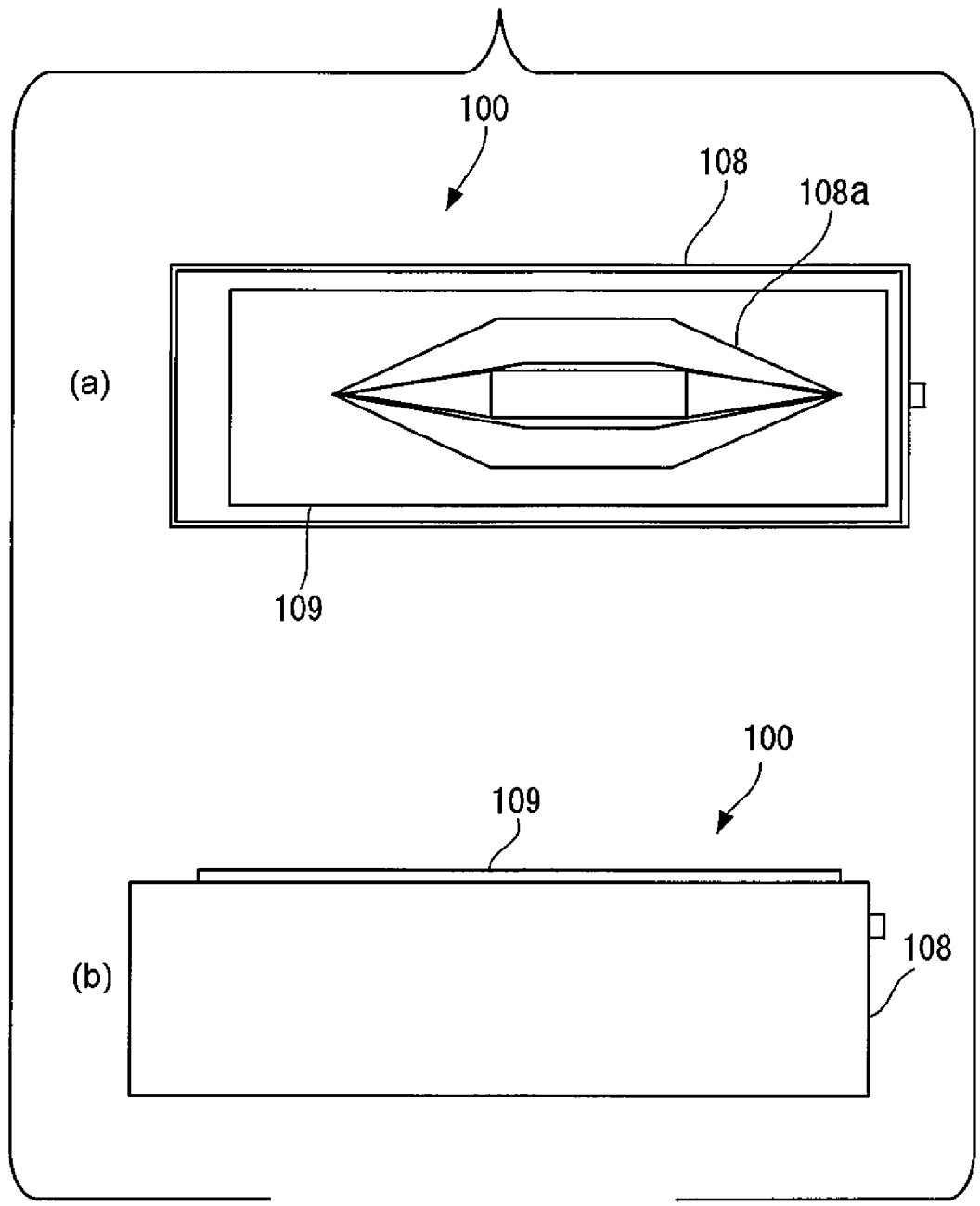
FIG. 6 is a view illustrating a state of the completion of the strip line cell 100.

FIG. 3 is a view illustrating a first conductor board 101 and a second conductor board 102 on the strip line cell 100. FIG. 4 is a view illustrating a state that a terminator resistance 103 is connected, and the first conductor board 101 and the second conductor board 102 are covered with a masking shield 104. FIG. 5 is a view illustrating a state that a metal 105 for fixing a case of the strip line cell 100 is installed in the state of FIG. 4. FIG. 6 is a view illustrating a state of the completion of the strip line cell 100. Part (a) of those individual figures is a top view. Part (b) of those individual figures is a side view.

As mentioned above, according to the present embodiment, there is provided such a design that interval H2 between the first conductor board 101 and the second conductor board 102 becomes ⅕ of the width H1 of the first conductor board 101 that is almost the same width as the width of RFID tag T1 to be examined. This value of ⅕ is the one calculated so that the design value of the characteristic impedance of the strip line cell 100 may become 50 ohms. The explanation is omitted here about the computation method because it is well-known. Further, there is provided such a design that length of the first conductor board 101 is the length of about ½ wavelength of the electric wave of the frequency named 953 MHz that is a communication frequency of RFID tag T1 and is used at the time of the examination. Furthermore, as seen in FIG. 3, a terminal connector 106 with which the terminator resistance 103 is connected is installed at the edge at the left of the first conductor board 101, and an input connector 107 to which an electric signal from the reader writer 20 is input is installed at a right edge. The actual measurement value of the characteristic impedance of the strip line cell 100 is 57.36 ohms. So-called standing-wave ratio (SWR: Standing Wave Ratio), which represents the degree of the supplying electric power to the discharged electric wave on the strip line cell 100, is 1.26.

A masking shield 104 of FIG. 4 is provided with an opening 104a for passing the semi-TEM wave W2 that originates the first conductor board 101 through the opening 104a. The size of the opening 104a is designed in such a manner that the extension of the semi-TEM wave W2 stops within the range necessary and sufficient for the examination intended for RFID tag T1. The masking shield 104 corresponds to one example of the masking shield referred to in the present invention.

A case 108 (FIG. 6) with which individual conductor boards are covered, which is fixed by a metal fitting 105 of FIG. 5, is provided with an opening 108a that is wider than the opening 104a of the masking shield 104. In addition, the opening 108a is blocked with a putting board 109 made of the acrylic fiber where the RFID tag T1 to be examined is put. The putting board 109 corresponds to one example of the putting board referred to in the present invention.

Figure 7:
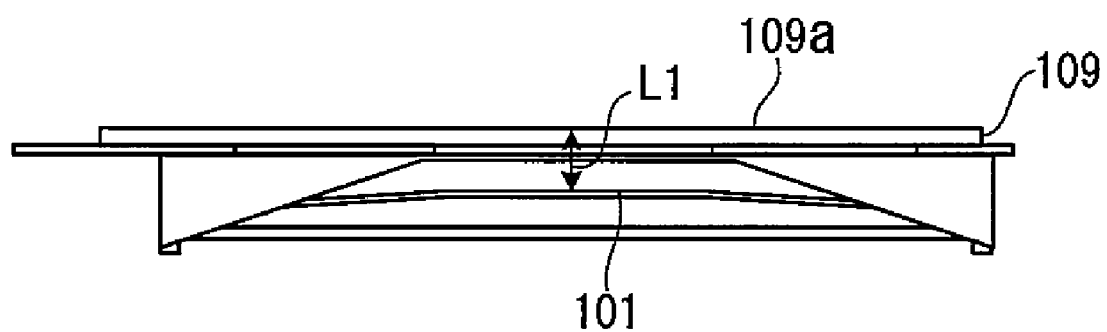
FIG. 7 is a view illustrating an interval between a putting side 109a of a putting board 109 and the first conductor board 101.

FIG. 7 is a view illustrating an interval between a putting side 109a of the putting board 109 and the first conductor board 101.

According to the present embodiment, an interval L1 between the putting side 109a and the first conductor board 101 is 7.4 mm, and the thickness of the putting board 109 is designed in such a manner that the interval is implemented.

Here, it will be explained based on the actual measurement value that the above-mentioned semi-TEM wave W2 attenuates rapidly while leaving the putting side 109a in the strip line cell 100 as explained above. The actual measurement value is obtained in such a manner that when an electric signal having the electric power of 25.5 dBm is input to the strip line cell 100 from the reader writer 20, a standard dipole antenna is arranged in the following three places which are mutually different in the distance from first conductor board 101 and electric field strength is measured at each position. First of all, the measurement was performed in a state that the distance from the first conductor board 101 is 7.4 mm, that is, in a state that the standard dipole antenna is arranged on the putting side 109a, next, the measurement was performed at the position where the distance is 100 mm, and, in addition, the measurement was performed at the position at 150 mm. When the result is indicated by the amount of attenuation that corresponds to the electric power of the input electric signal based on the measurement result at the position at 7.4 mm, it becomes 0 dB because here is a standard in the position at 7.4 mm, it becomes −11.9 dB in the position at 100 mm, and it becomes −24.5 dB in the position at 150 mm. It is understood from the result that the amount of attenuation attenuates to the half almost by the dB display to 25.5 dBm of the amount of input at the position at 100 mm, and almost attenuates at the position of 150 mm.

Thus, the range where the semi-TEM wave W2 that originates the strip line cell 100 reaches is limited, and the RFID tag test apparatus 1 of FIG. 1 involves no anxiety that the radio wave signal, which originates the strip line cell 100, is transmitted to the surrounding exceeding the examination area. According to the RFID tag test apparatus 1, the RFID tag T1 is put on the putting side 109a at the time of the examination.

Next, there will be explained another example of the strip line cell.

Figure 8:
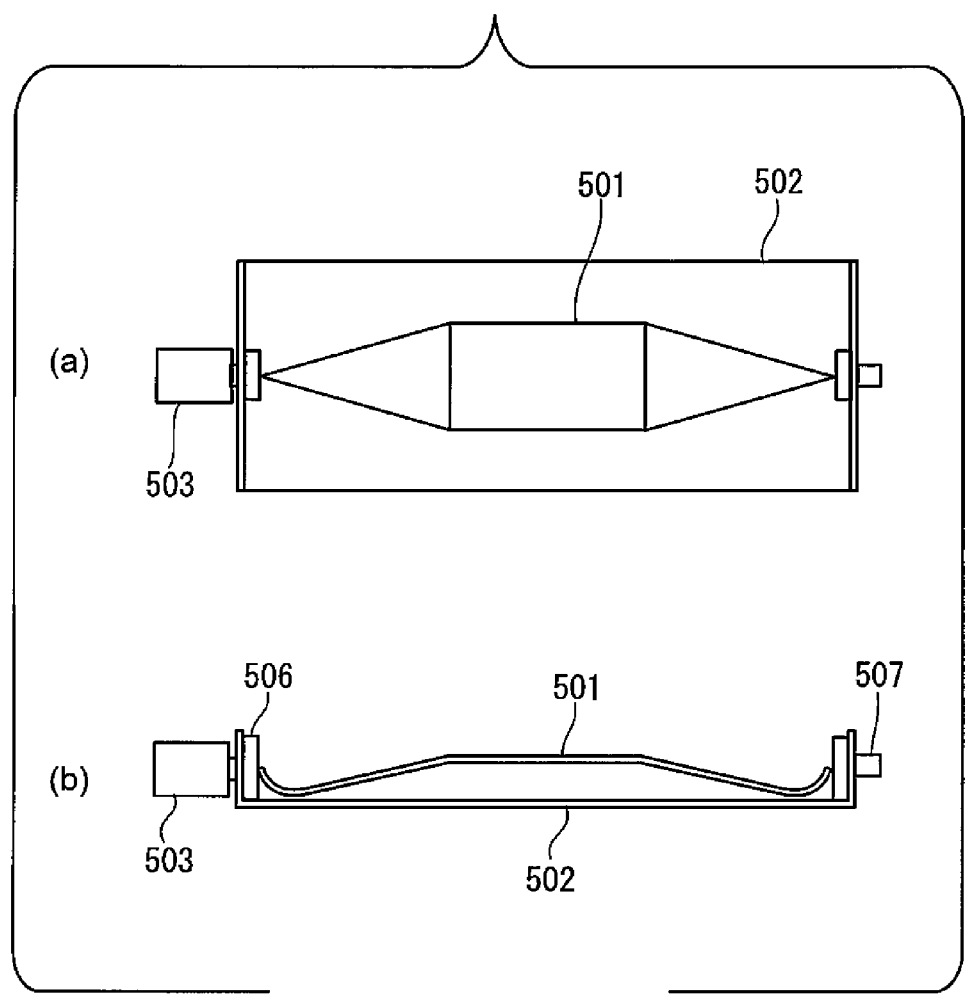
FIG. 8 is a view illustrating a first conductor board 501 and a second conductor board 502 on a strip line cell 500 in other example.
Figure 9:
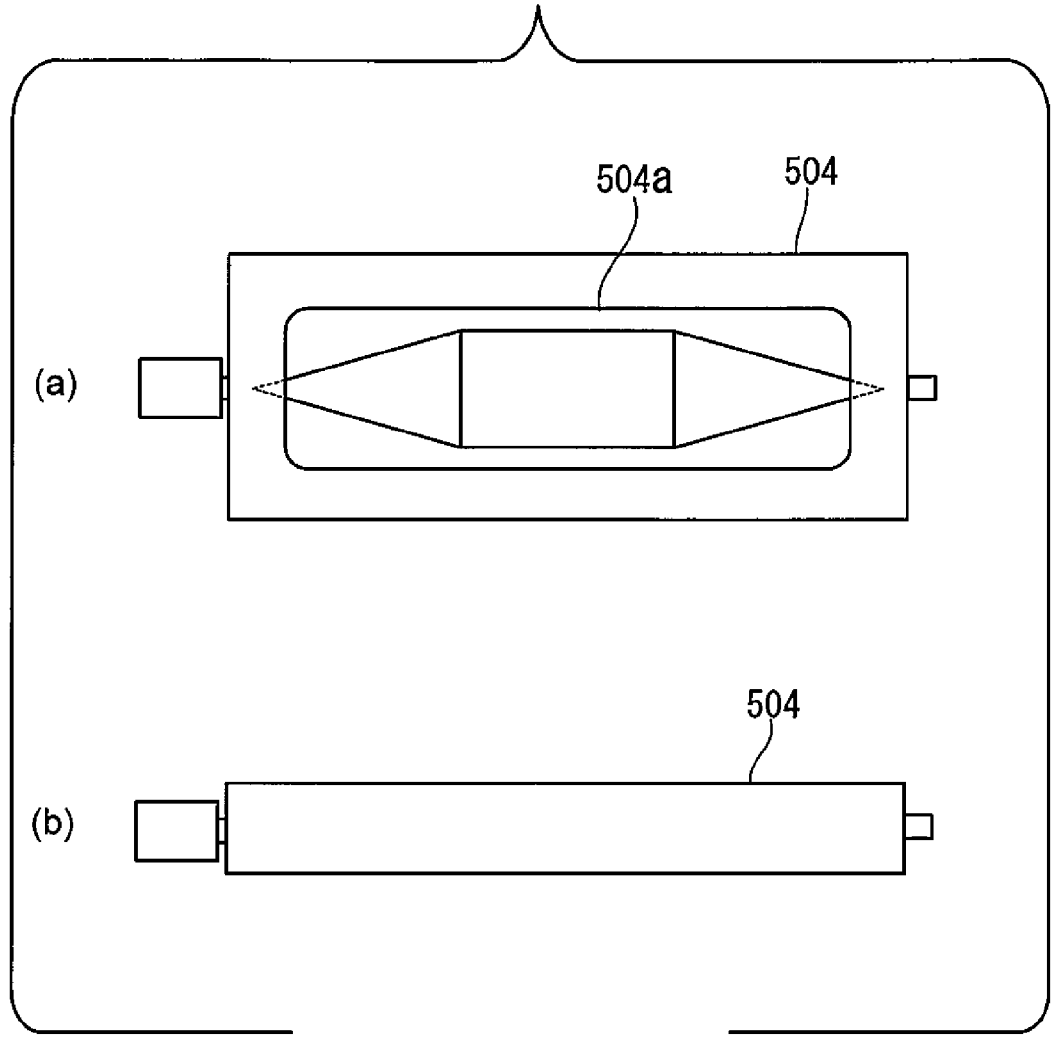
FIG. 9 is a view illustrating a state that the first conductor board 501 and the second conductor board 502 are stored in a case 504 that serves also as a masking shield.
Figure 10:
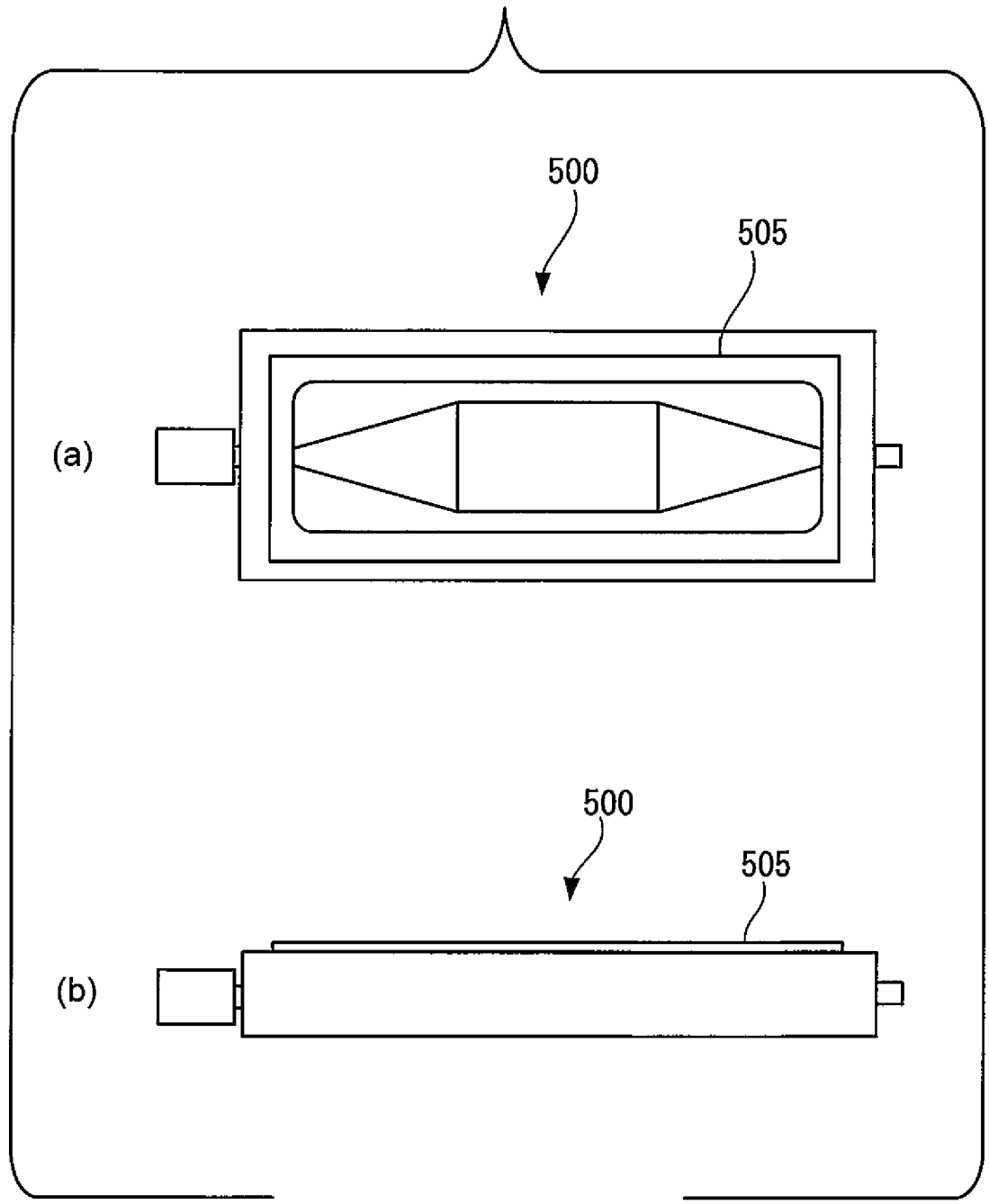
FIG. 10 is a view illustrating a state of the completion in which a putting board 505 is installed in the state of FIG. 9.
Figure 11:
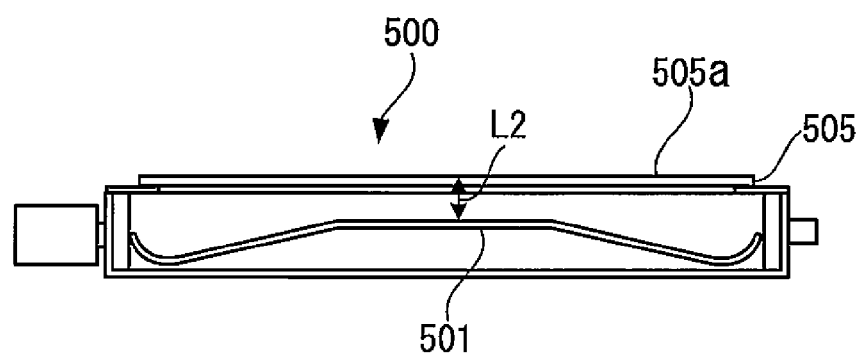
FIG. 11 is a sectional view of the strip line cell in other example.

FIG. 8 is a view illustrating a first conductor board 501 and a second conductor board 502 on a strip line cell 500 in other example. FIG. 9 is a view illustrating a state that the first conductor board 501 and the second conductor board 502 are stored in a case 504 that serves also as a masking shield. FIG. 10 is a view illustrating a state of the completion in which a putting board 505 is installed in the state of FIG. 9. FIG. 11 is a sectional view of the strip line cell in other example. Part (a) of individual figures (FIG. 8 to FIG. 10) is a top view. Part (b) of individual figures (FIG. 8 to FIG. 10) is a side view.

As for the strip line cell 500 of this another example, in a similar fashion to the strip line cell 100 as mentioned above, it is designed in such a manner that the characteristic impedance may become 50 ohms and the use frequency may become 953 MHz.

The strip line cell 500 of this another example is the one wherein it is attempted in a further reducing the thickness in such a manner that the second conductor board 502 serves as the bottom etc. of the storage case. Moreover, according to the strip line cell 500 of this another example, a terminator resistance 503 is installed in transverse though the terminator resistance 103 is installed turning to the bottom side of the case 108 on the strip line cell 100 as mentioned above. In addition, according to a terminal connector 506 and an input connector 507 that is installed in the strip line cell 500 of this another example, the first conductor board 501 is connected directly to the connector terminal on an internal side of the strip line cell 500. In view of the fact that the second conductor board 502 is of the shape of making wide somewhat, an opening 504a installed in a case 504, which is prepared for passing the semi-TEM wave, is also a rectangular one of making wide as compared with the opening 104a on the strip line cell 100 as mentioned above. Moreover, according to the strip line cell 500 of this another example, as seen from FIG. 11, interval L2 between the first conductor board 501 and a putting side 505a is somewhat far 9.7 mm as compared with the distance on the strip line cell 100 as mentioned above, in view of the restrictions of the shape of the case 504. It is possible that the strip line cell 500 of another example as mentioned above also obtains a performance almost similar to the strip line cell 100 as mentioned above.

Next, it explains the examination contents to be executed with the RFID tag test apparatus 1 of FIG. 1, which has the strip line cell 100 illustrated in FIG. 3 to FIG. 7.

The RFID tag receives the radio wave signal, wherein the antenna connected with the reader writer and the like sends with a predetermined output. The RFID tag has the communication limit distance where the reception of the radio wave signal sent with such an output is possible, since the radio wave signal may attenuate while parting from the antenna. The communication limit distance is one of the important indices that represent the communication performance of the RFID tag. Hitherto, the communication limit distance is determined by the following procedures in a special test atmosphere such as the RF anechoic chambers for instance. First of all, the antenna is connected with the reader writer, and the RFID tag to be examined is arranged opposing it to the antenna. Next, the radio wave signal is sent from the antenna with an output which is an equal output at the time when the RFID tag is used, and the RFID tag is kept away from the antenna gradually while confirming the presence of the response signal from the RFID tag to be examined. And, the distance from the antenna when the response signal from the RFID tag is not confirmed is adopted as a communication limit distance of the RFID tag. Such a series of work becomes a big load for the worker and is a cause of disturbing the efficiency improvement of development and manufacturing of the RFID tag, by the reasons that it requires a special environment as mentioned above, it is necessary to move the RFID tag to be examined at the time of examination to the special environment, and it should move the RFID tag in the special environment.

To the contrary, according to the RFID tag test apparatus 1 of FIG. 1, if the preliminary work, which will be explained hereinafter, is executed once, only putting the RFID tag T1 to be examined on the putting board 109 of the strip line cell 100 (Refer to FIG. 6) makes it possible to automatically obtain the communication limit distance in the computer 30. The computer 30 serves as one example of the conversion section referred to in the present invention.

First of all, it explains the preliminary work.

According to the present embodiment, the RF anechoic chamber is used in the preliminary work.

Figure 12:
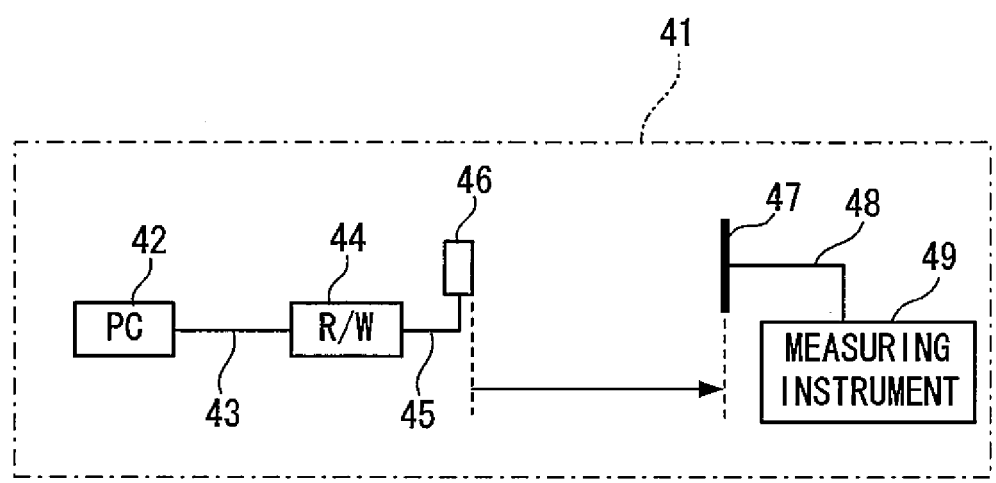
FIG. 12 is a view useful for understanding work in an RF anechoic chamber in a preliminary work.

FIG. 12 is a view useful for understanding work in an RF anechoic chamber in the preliminary work.

In the preliminary work, there are prepared a computer 42 and a reader writer 44, which are equal to the computer 30, and the reader writer 20 of the RFID tag test apparatus 1 illustrated in FIG. 1, and those are arranged in an RF anechoic chamber 41. Those devices are connected with one another through a third cable 43. The reader writer 44 is connected with a predetermined antenna through a fourth cable 43. In addition, a standard dipole antenna 47 is arranged at the predetermined initial position opposed to the antenna 46. The standard dipole antenna 47 is connected through a fifth cable 48 with a measuring instrument 49 that measures electric field strength in the radio wave signal that the standard dipole antenna 47 receives.

Work in the RF anechoic chamber 41 is proceeded as follows.

First of all, the computer 42 instructs the reader writer 44 the effect to send the radio wave signal with an output equal to the output when the RFID tag is used. And, the standard dipole antenna 47 is moved at intervals of 10 cm from an initial position in the direction where the standard dipole antenna 47 goes away from the antenna 46 while the measuring instrument 49 measures the electric field strength in the radio wave signal that is sent from the antenna 46 according to the instruction and receives with the standard dipole antenna 47. The work in the RF anechoic chamber 41 determines the association between the electric field strength in the radio wave signal that the standard dipole antenna 47 receives, and the distance between the antenna 46 and the standard dipole antenna 47. On the other hand, the association between the distance and the electric field strength corresponds to the association between the electric field strength in the radio wave signal that the RFID tag of the examination object will receive, and the distance between the antenna 46 and the RFID tag when assuming that the antenna 46 connected to the reader writer 44 sends an radio wave signal with a predetermined output and the RFID tag to be examined receives the radio wave signal.

In the preliminary work, the following work to use RFID tag test apparatus 1 illustrated in FIG. 1 in addition to the work in the RF anechoic chamber 41 explained above is performed.

However, according to this work, the standard dipole antenna 47 is put on the putting board 109 of the strip line cell 100 instead of the RFID tag T1 to be examined, and the measuring instrument 49 is connected with the standard dipole antenna 47. According to this work, the computer 30 instructs the reader writer 20 to supply an electric signal to the strip line cell 100 while increasing the electric power from 0 dBm to 25.5 dBm at intervals of 0.5 dB. And, there is measured the electric field strength in the radio wave signal that the standard dipole antenna 47 receives when an electric signal of each electric power is supplied. The work using the RFID tag test apparatus 1 determines the association between the electric field strength in the radio wave signal that the standard dipole antenna 47 receives, and the electric power of the electric signal to be supplied to the strip line cell 100. The association between the electric power and the electric field strength corresponds to the association between the electric field strength in the radio wave signal that the RFID tag to be examined will receive when the performance examination that uses the RFID tag test apparatus 1 is carried out, and the electric power of the electric signal to be supplied to the strip line cell.

Figure 13:
FIG. 13 is a view where a relation of distance vs. electric field strength acquired by a preliminary work and a relation of electric power vs. electric field strength are represented by a table form.

FIG. 13 is a view where a relation of distance vs. electric field strength acquired by a preliminary work and a relation of electric power vs. electric field strength are represented by a table form.

As for table Tab of FIG. 13, there are illustrated the association Ta1 between the distance and the electric field strength left, and the association Ta2 between the electric power and the electric field strength right. In the association Ta2 between the electric power and the electric field strength, the electric field strength is depicted by two kinds of units of V/m and dBµV/m.

Figure 14:
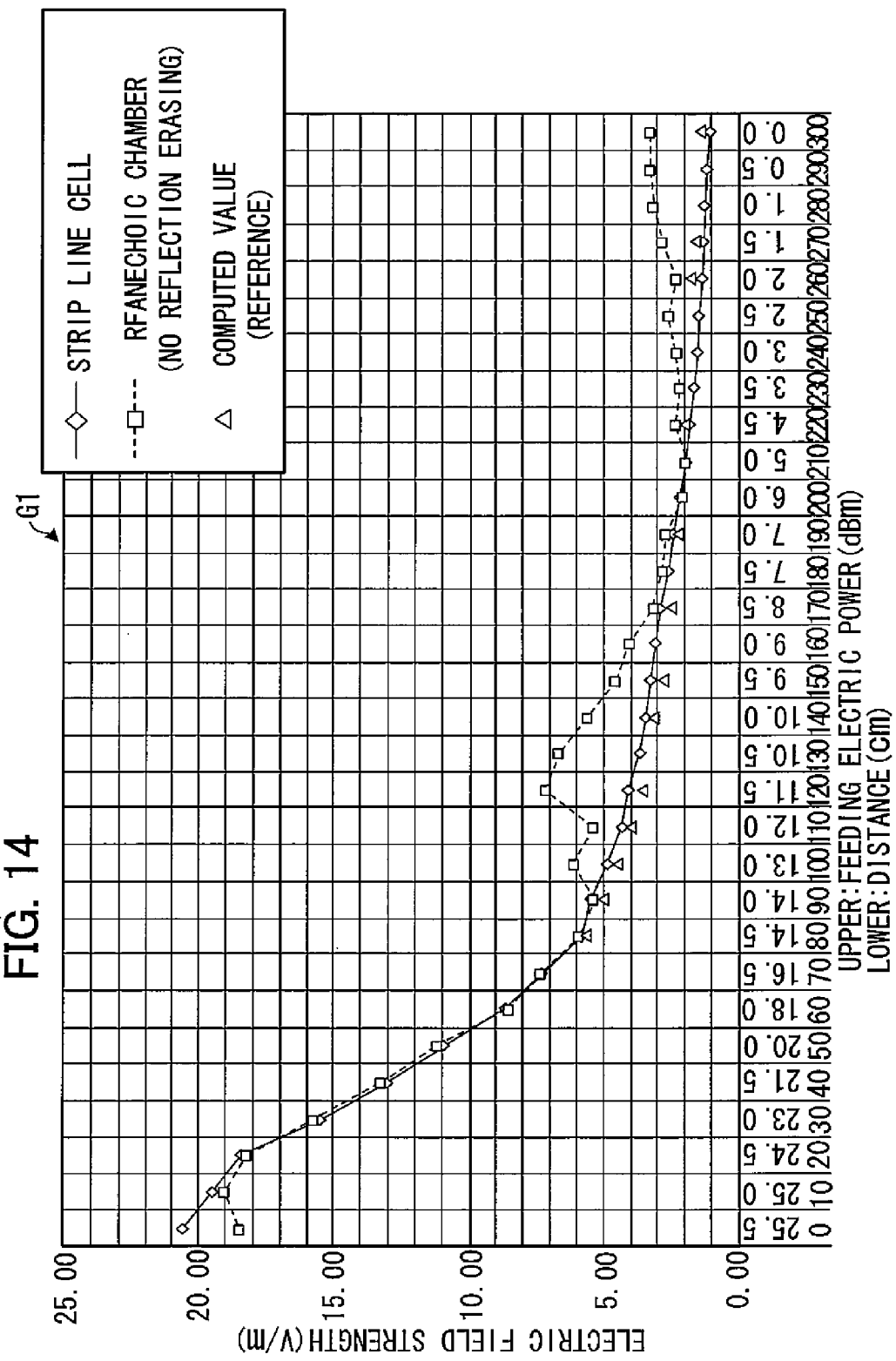
FIG. 14 is a view where a relation of distance vs. electric field strength depicted with a table form in FIG. 13 and a relation of electric power vs. electric field strength, are represented by a graph form.

FIG. 14 is a view where a relation of distance vs. electric field strength depicted with a table form in FIG. 13 and a relation of electric power vs. electric field strength, are represented by a graph form.

In graph G1 of FIG. 14, the electric field strength is taken in a vertical axis, and the electric power and the distance are taken in a horizontal axis. And, in the graph G1, there are plotted in quadrangle points the relation of distance vs. electric field strength obtained through the work using the RF anechoic chamber 41, and there are plotted in diamond points the relation of electric power vs. electric field strength obtained through the work using the RFID tag test apparatus 1. In addition, in the graph G1, there are plotted in triangular points for reference the computing result wherein the relation of distance vs. electric field strength is computed using a predetermined official theory but not depending on the work using the RF anechoic chamber 41.

The relation of distance vs. electric field strength based on the measurement shifts from the relation of distance vs. electric field strength based on an official theory in the range from 100 cm to 160 cm in the distance and the range of 220 cm or more, because the reflections of some electric waves are caused also in the RF anechoic chamber 41. According to the present embodiment, the correction that excludes such a discrepancy is performed from the value of the electric field strength in the relation of distance vs. electric field strength based on the measurement. In relation Ta1 of electric power vs. electric field strength in table Tab of FIG. 13, the electric field strength after the correction is depicted with ( ).

Figure 15:
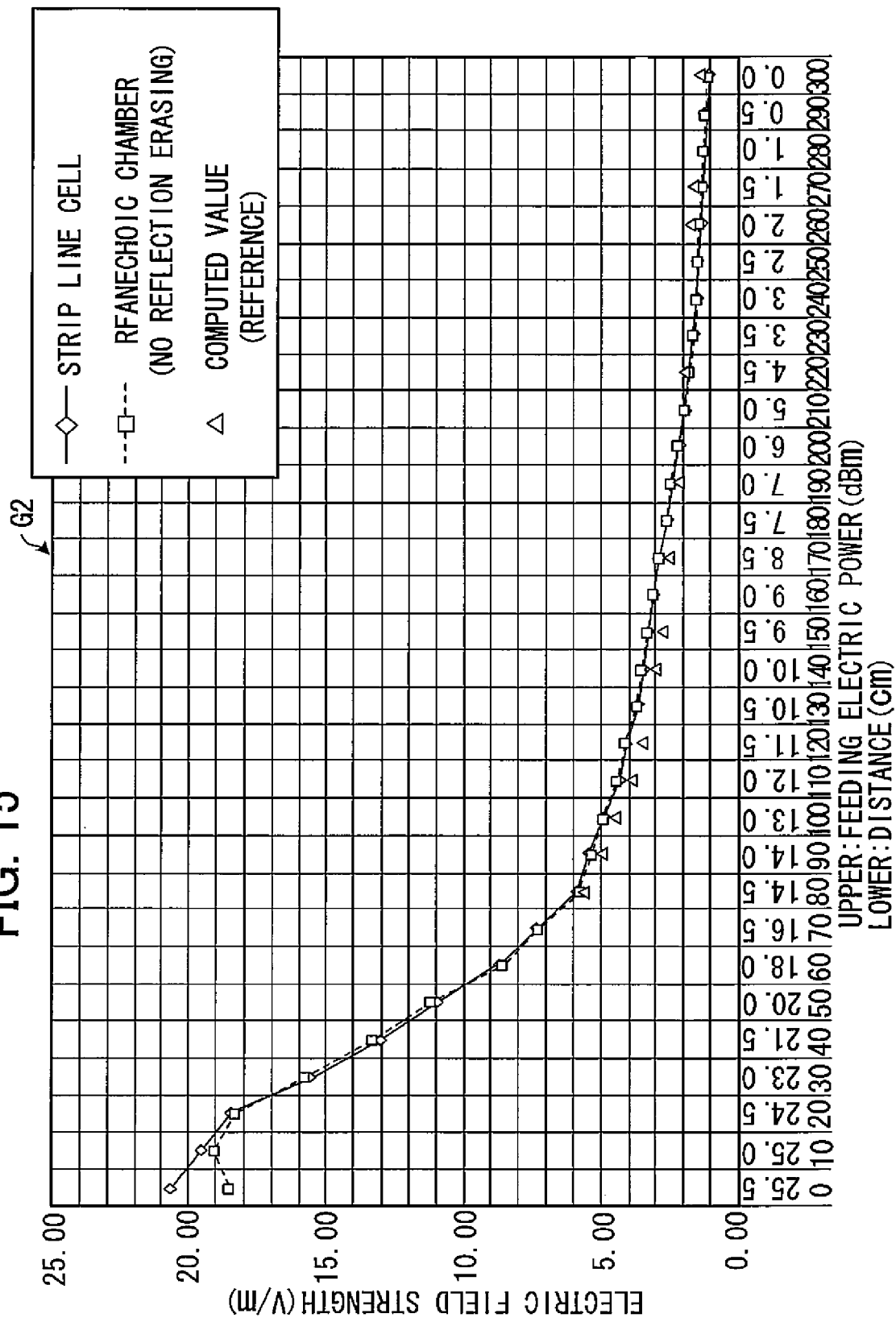
FIG. 15 is a view where a relation of distance vs. electric field strength after correction and a relation of electric power vs. electric field strength, are represented by a graph form.

FIG. 15 is a view where a relation of distance vs. electric field strength after correction and a relation of electric power vs. electric field strength, are represented by a graph form.

As seen from FIG. 15, the dotted line representative of the relation of distance vs. electric field strength after correction is substantially coincident with a solid line representative of the relation of electric power vs. electric field strength when each distance at intervals of 10 cm from 0 cm to 300 cm and each electric power at intervals of 0.5 dB from 25.5 dBm to 0.0 dBm are made to correspond to the one to one mutually. Thus, according to the present embodiment, in the preliminary work, there is created in the table Tab of FIG. 13 the relation of electric power vs. distance in which each electric power in the relation Ta2 of electric power vs. distance is associated with each distance in the relation Ta1 of distance vs. electric field strength in such a manner that the values described in the same line are associated with one another. The relation of electric power vs. distance thus created is stored in a memory (not illustrated) of the computer 30 of the RFID tag test apparatus 1 of FIG. 1. Thus, the preliminary work ends above. Here, the relation of the electric power vs. distance corresponds to one example of the conversion relation referred to in the present invention.

Next, there will be explained performance examination to be executed with the RFID tag test apparatus 1 under control of the computer 30 of FIG. 1, using the relation of electric power vs. distance that is determined with the preliminary work.

Figure 16:
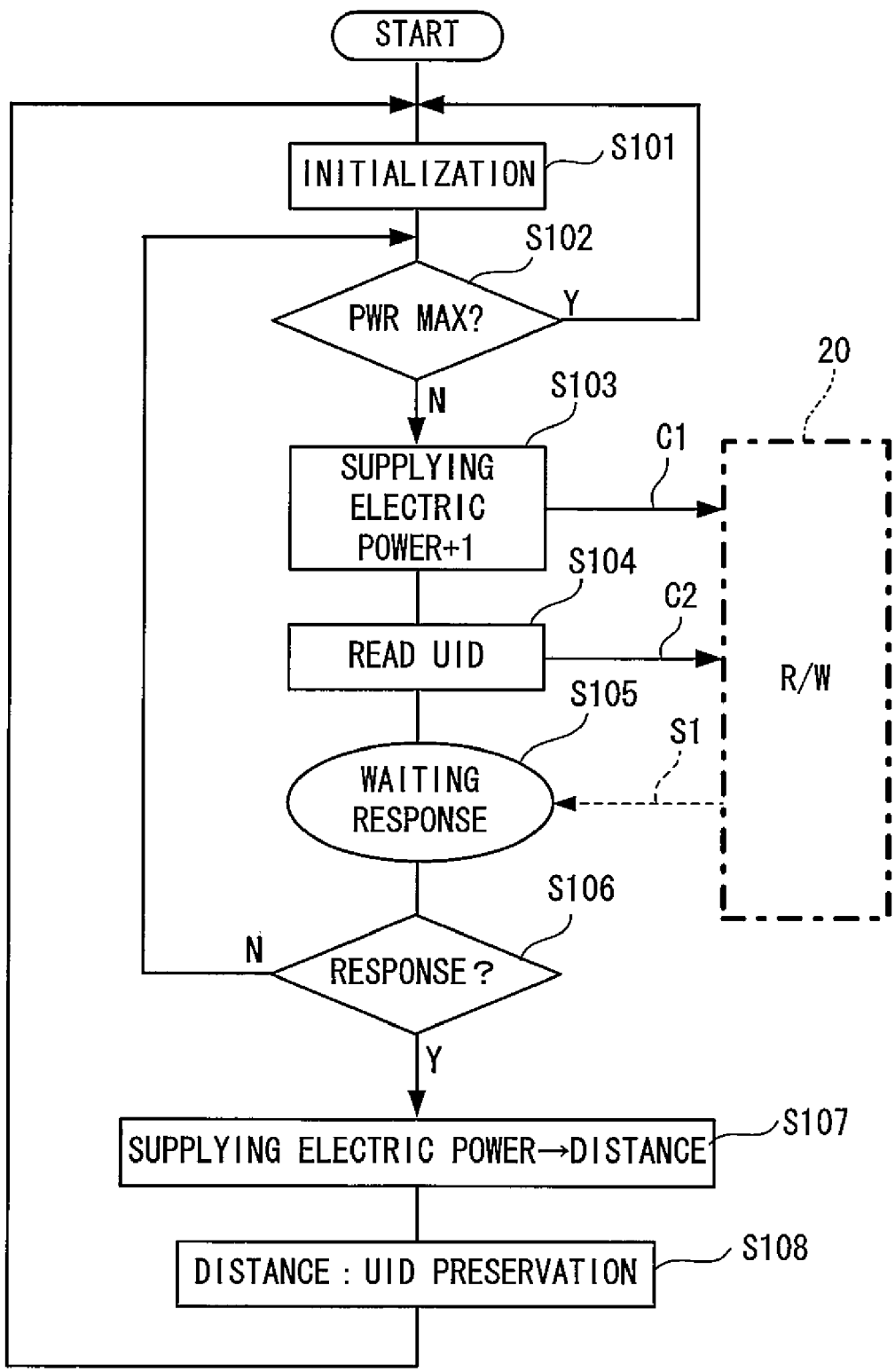
FIG. 16 is a flowchart useful for understanding a flow of performance examination to be executed with the RFID tag test apparatus 1.

FIG. 16 is a flowchart useful for understanding a flow of performance examination to be executed with the RFID tag test apparatus 1.

Here, the processing of the flowchart of FIG. 16 corresponds to one example of the test method referred to in the present invention.

The processing of the flowchart of FIG. 16 starts when the user directs computer 30 the start of the performance examination through a predetermined operation. When the processing starts, first of all, after the execution of a predetermined initialization including processing that sets the electric power of the electric signal supplied to the strip line cell 100 to 0 dBm directs it, the computer 30 becomes a stand-by state for the reader writer 20 (step S101). And, the RFID tag T1 to be examined is arranged on the strip line cell 100 of the RFID tag test apparatus 1, and the user directs the computer 30 the start of the performance examination to the RFID tag T1 through a predetermined operation. Then, the process goes to the next step (step S102).

In step S102, it is judged whether the electric power of the electric signal set in the reader writer 20 is the maximum set value (25.5 dBm in the present embodiment) now. However, the process goes to the next step S103 processing because a set value of the electric power is not the maximum set value (No judgment in step S102) just behind the initialization in step S101.

In step S103 processing, as a set value of the electric power in the reader writer 20, there is computed the value that only an increase of a predetermined interval correspondence (0.5 dB in the present embodiment) is added to a present set value, and command C1 directed to set the computing result to the electric power of the electric signal supplied to the strip line cell 100 is sent to the reader writer 20.

Here, identification information (UID: Unique Identifier) used to distinguish the RFID tag T1 from other RFID tag is stored in the RFID tag T1 to be examined in the present embodiment.

Next, when the setting of the electric power is directed by processing of the step S103, command C2 that directs the effect to supply the demand signal to demand UID from RFID tag T1 to be examined to striptease line cell 100 is sent to reader writer 20 (step S104).

Processing that is a combination of the processing of the step S104 and the processing of the step S103 corresponds to one example of the supply process referred to in the present invention.

The reader writer 20 supplies a demand signal having the electric power set as mentioned above to the strip line cell 100. And, when the response signal S1 that indicates UID for the demand signal is output from the RFID tag T1, the reader writer 20 receives the response signal S1 through the strip line cell 100 and sends it to the computer 30.

On the other hand, the computer 30 shifts to the stand-by state of a predetermined time after step S104 (step S105). It is judged whether the response signal S1 is sent by the reader writer 20 after the predetermined time passes (step S106). Processing that is a combination of the processing of the step S106 and the processing of the step S105 corresponds to one example of the reaction confirmation process referred to in the present invention. When the response signal S1 is not sent by the reader writer 20 (No judgment in step S106), the process returns to the step S102, and processing from the step S102 to step S106 is repeated. This repetition keeps until a set value of the electric power reaches the maximum set value (Yes judgment in step S102), or until the response signal S1 is sent by the reader writer 20 (Yes judgment in step S106).

When the response signal S1 is sent by the reader writer 20, the computer 30 converts a set value of the electric power at that time into the distance in the RF anechoic chamber 41 illustrated in FIG. 12 from the antenna 46 by using the relation of electric power vs. distance mentioned above (step S107).

This conversion result corresponds, for instance, in the situation that the antenna 46 sends the radio wave signal according to the demand signal with a predetermined output and the RFID tag T1 to be examined receives it, to the distance where the RFID tag T1 first replies the response signal S1, when gradually bringing the RFID tag T1 from a position away enough close to the antenna 46, that is, the communication limit distance in which the RFID tag T1 can receive the radio wave signal where the antenna 46 originates. In step S107 processing, when such a communication limit distance of the RFID tag T1 to be examined is determined, the computer 30 associates the communication limit distance with UID that is represented by the response signal S1 from the RFID tag T1, and preserves it in a predetermined memory (step S108). And the process returns to the step S101, and after the execution of initialization is directed to the reader writer 20, it becomes the stand-by state of the performance examination to the following RFID tag.

Moreover, when the response signal S1 is not sent by the reader writer 20 and a set value of the electric power reaches the maximum, it becomes the stand-by state of the following performance examination after the process returns to the step S101 in which the execution of initialization is directed after it is displayed on a predetermined display screen that the RFID tag T1 to be examined is defective goods.

As explained referring to FIG. 1 to FIG. 16, with respect to the performance examination of determining the communication limit distance of the RFID tag to be examined, according to the present embodiment, if a predetermined preliminary work is executed once beforehand, an enough performance examination can be easily done without using a special environment such as the RF anechoic chambers.

Next, there will be explained the second embodiment of the present invention.

Figure 17:
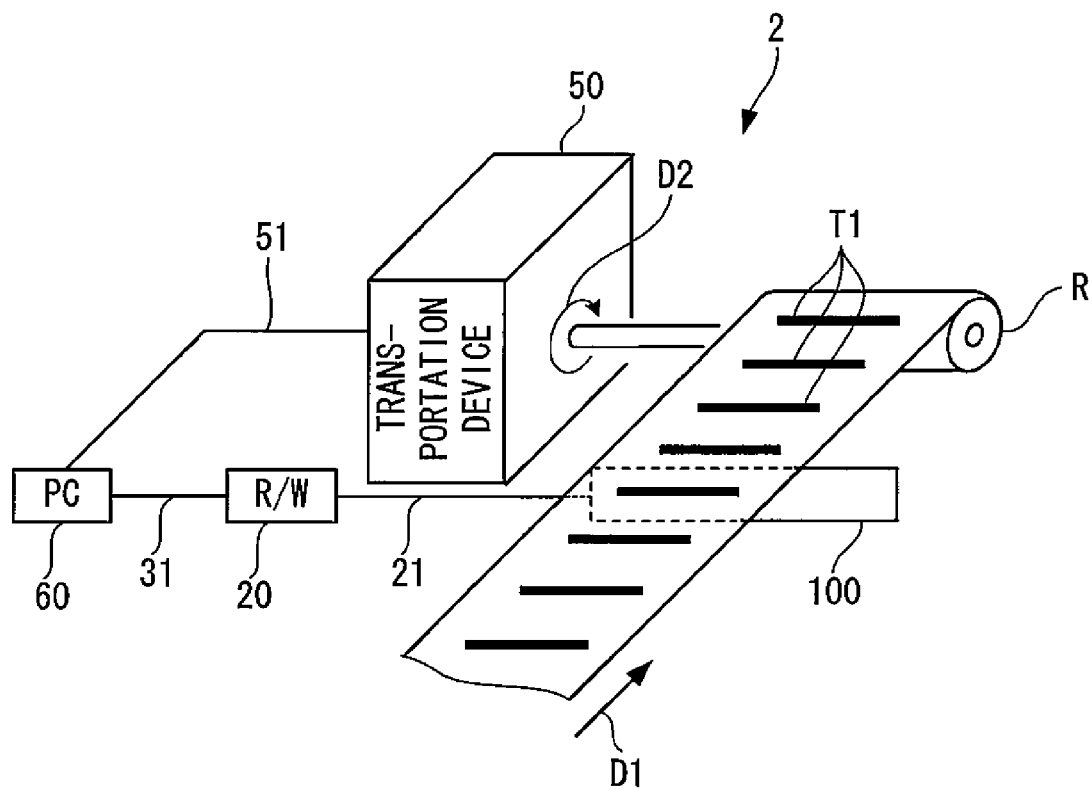
FIG. 17 is a view useful for understanding an RFID tag test apparatus according to a second embodiment of the present invention.

FIG. 17 is a view useful for understanding an RFID tag test apparatus according to a second embodiment of the present invention.

If the point to assume two or more RFID tags to be an examination object is excluded, RFID tag test apparatus 2 of FIG. 17 is equal to the RFID tag test apparatus 1 in the first embodiment of FIG. 1. Therefore, the same reference number as FIG. 1 is fixed, and, in the following, the repetition explanation of these components will be omitted about an equal component to FIG. 1 in FIG. 17.

In the RFID tag test apparatus 2, there is handled a tag role R where two or more RFID tags T1, in which integrated circuit chips are individually installed in two or more antenna patterns formed on a roll-like shaped base, respectively, are not yet separated as individual RFID tag. Individual RFID tag T1 of the tag role R is an object to be examined in the RFID tag test apparatus 2.

The RFID tag test apparatus 2 is provided with a transportation device 50 that sequentially transports individual RFID tag T1 in the tag role R to the strip line cell 100, and the transportation device 50 is connected with a computer 60 through the sixth cable 51. The computer 60 of the RFID tag test apparatus 2 controls the transportation device 50 as well as the reader writer 20. When the computer 60 sends the following commands to the transportation device 50, the transportation device 50 rotates a center axis of the tag role R in the direction of arrow D2 by the amount of the sending so as to send the RFID tag T1 of the tag role R in the direction of arrow D1 by arrangement intervals. As a result, individual RFID tags T1 of the tag role R are sequentially transported to the strip line cell 100, and the performance examination mentioned above is applied at the position of the strip line cell 100. Here, the transportation device 50 corresponds to one example of the transportation section referred to in the present invention.

Figure 18:
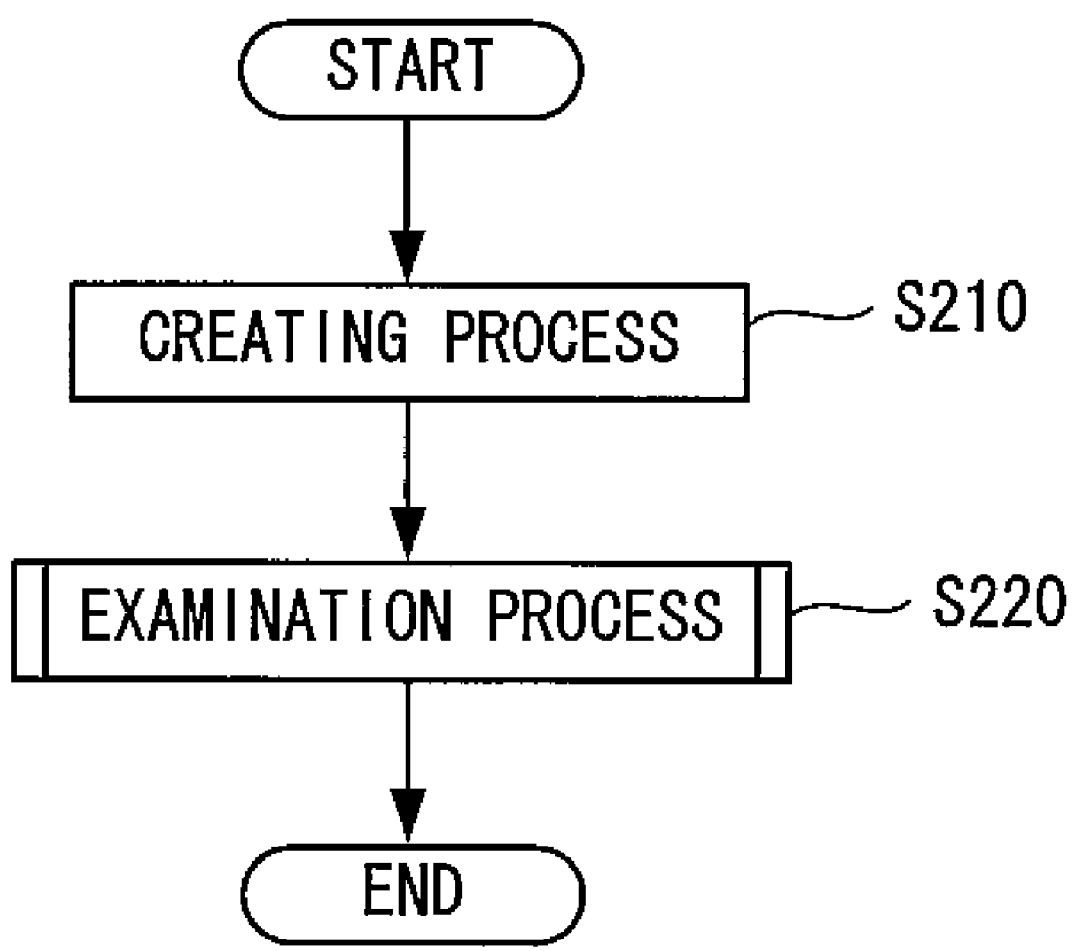
FIG. 18 is a flowchart useful for understanding a manufacturing method of the RFID tag, including the examination process of the RFID tag using RFID tag test apparatus 2 represented in FIG. 17.

FIG. 18 is a flowchart useful for understanding a manufacturing method of the RFID tag, including the examination process of the RFID tag using RFID tag test apparatus 2 represented in FIG. 17.

The method of manufacturing the RFID tag represented in FIG. 18 has a creating process (step S210) of creating the tag role R, and an examination process (step S220) of carrying out the performance examination of determining the communication limit distance of individual RFID tag T1 of the tag role R. The method of manufacturing the RFID tag represented in FIG. 18 corresponds to one example of the manufacturing method referred to in the present invention. The creating process (step S210) and the examination process (step S220) corresponds to one example of the creating step (step S210) and the examination step (step S220) referred to in the present invention, respectively. The examination process (step S220) serves as one embodiment of the test method of the present invention. Here, the explanation is omitted about details of the creating process of creating the tag role R because the creating process is well-known.

Figure 19:
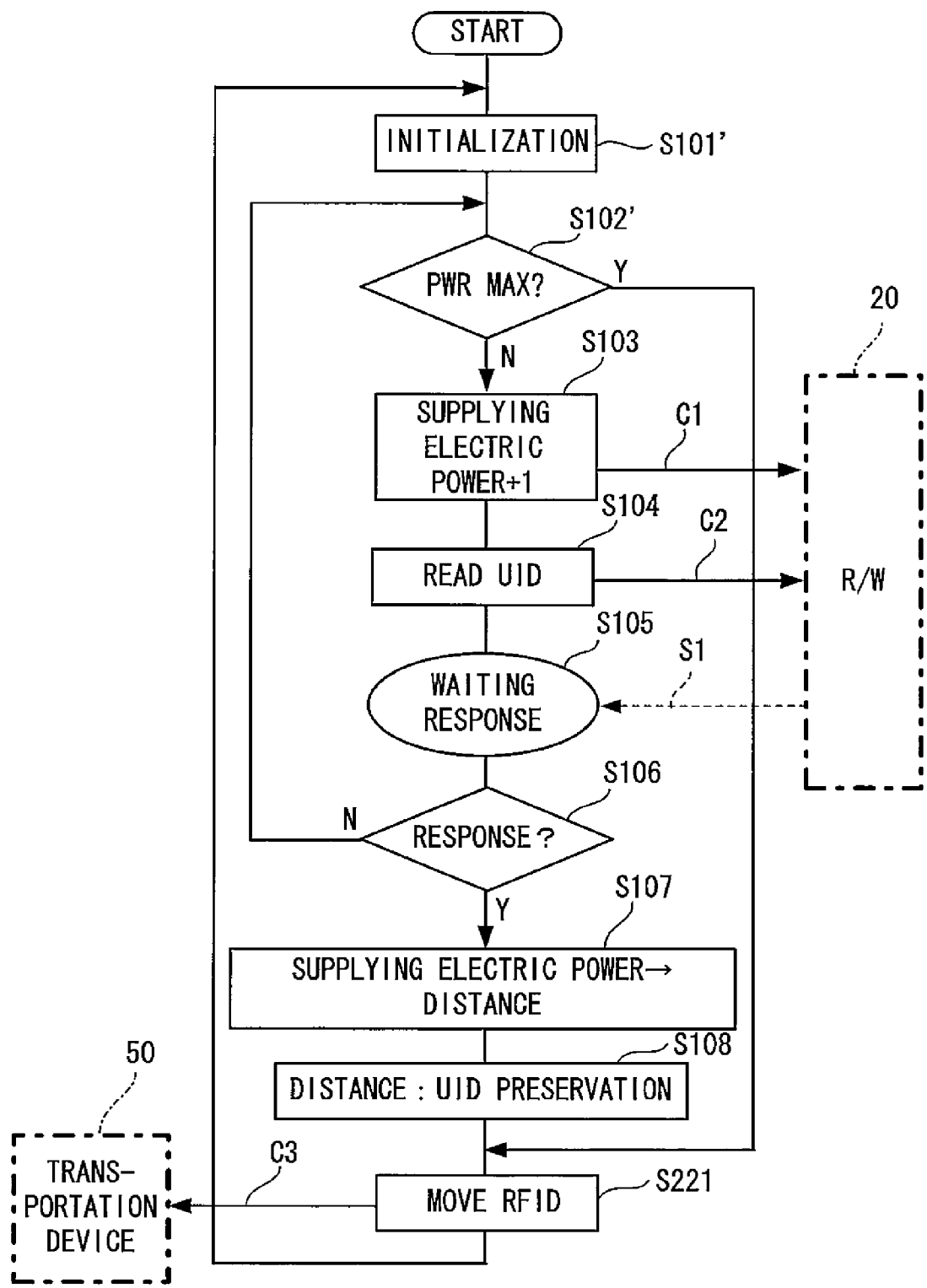
FIG. 19 is a flowchart useful for understanding a detailed flow of the examination process (step S220) in FIG. 18.

FIG. 19 is a flowchart useful for understanding a detailed flow of the examination process (step S220) in FIG. 18. The examination process that the flow chart of FIG. 19 depicts is almost equal to the processing that the flow chart of FIG. 16 depicts excluding the point to have processing (step S221) that sends the command that directs the transportation device 50 to perform transportation. Therefore, in FIG. 19, with respect to the same processing process as that in the flowchart of FIG. 16, the same reference number as FIG. 16 is applied, and, in the following, the repetition explanation of these processing processes will be omitted.

While the initialization processing (step S101) depicted in FIG. 16 is processing that becomes a stand-by state after giving the instruction of initialization to the reader writer, the initialization processing (step S101') depicted in FIG. 19 is processing that omits such a stand-by state and proceeds to the following processing. Moreover, while the processing of step S102 depicted in FIG. 16 is processing that returns to the initialization processing (step S101) when the electric power reaches the maximum set value, the processing of the step S102' following to step S101' is processing that does not return to the initialization processing (step S101') and proceeds to the processing of step S221 which will be explained as follows.

The processing of step S221 is executed in the event that the communication limit distance is determined on the RFID tag T1 which is now located at the position of the strip line cell 100, and the communication limit distance is preserved through step S108 processing, or in the event that in the processing of step S102', it is judged that electric power reaches the maximum setting value (Yes judgment in step S102'). In the processing of step S221, the computer 60 sends to the transportation device 50 the command C3 to direct to rotate around a center axis of tag role R by the angle that corresponds to the transportation for the arrangement interval. When the transportation device 50 operates in accordance with the command C3, RFID tag T1 that is not yet examined is disposed at the position of strip line cell 100 instead of the examined RFID tag T1.

As mentioned above, according to the second embodiment explained referring to FIG. 1 to FIG. 17, it is possible to efficiently examine two or more RFID tags T1, and also to manufacture efficiently such two or more RFID tags T1 consequently.

Next, there will be explained a third embodiment of the present invention.

Figure 20:
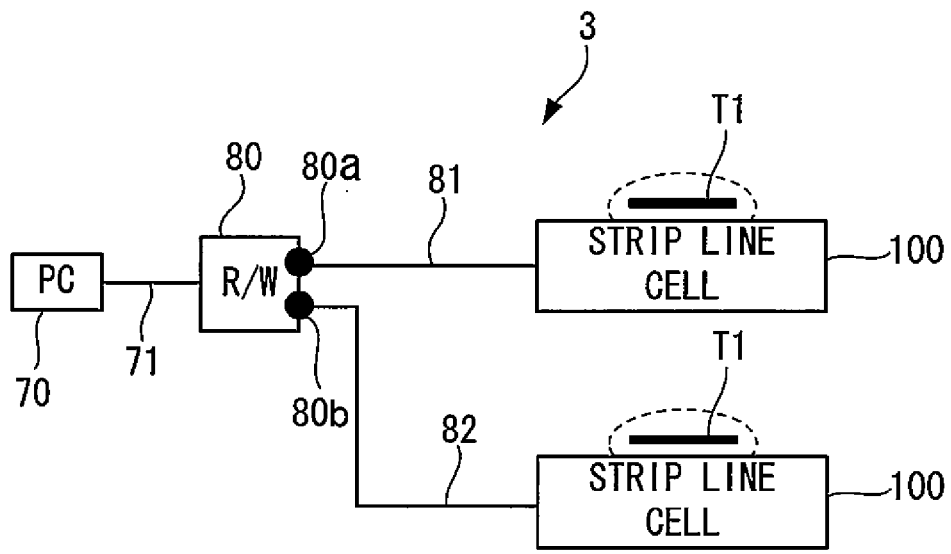
FIG. 20 is a view useful for understanding an RFID tag test apparatus according to a third embodiment of the present invention.

FIG. 20 is a view useful for understanding an RFID tag test apparatus according to a third embodiment of the present invention.

RFID tag test apparatus 3 of FIG. 20 is equal to the RFID tag test apparatus 1 of the first embodiment of FIG. 1 excluding the point that there are provided two or more strip line cells. Therefore, in FIG. 20, with respect to the same structural element as that of FIG. 1, the same reference number as FIG. 1 is applied, and, in the following, the repetition explanation of these structural elements will be omitted.

As seen from FIG. 20, the RFID tag test apparatus 3 of the third embodiment has mutually equal two strip line cells 100, and the two strip line cells 100 are connected through the 7th cable 81 and the 8th cable 82 with two electric power supply sections 80a and 80b (Hereafter, it is called the port) which one reader writer 80 is provided with, respectively. Here, an electric signal is supplied to each strip line cell 100 by each port of the reader writer 80 in mutually different timing as follows.

Figure 21:
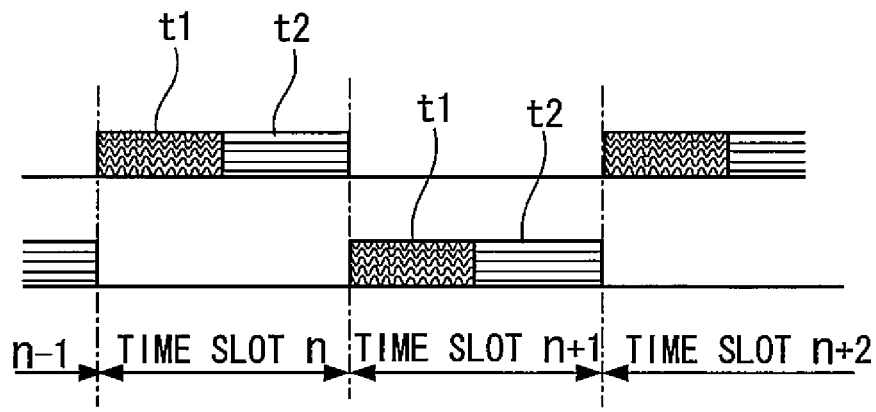
FIG. 21 is a pattern diagram useful for understanding a state that an electric signal is supplied to individual strip line cells 100 illustrated in FIG. 20 in mutually different timing.

FIG. 21 is a pattern diagram useful for understanding a state that an electric signal is supplied to individual strip line cells 100 illustrated in FIG. 20 in mutually different timing.

According to the present embodiment, the examination that uses two strip line cells 100 is time-shared and executed by two or more time slot. In one time slot, a supply of an electric signal corresponding to a certain set electric power and the reception of the response signal are performed to other strip line cell 100. Top and bottom two stages of FIG. 21 depict time slots corresponding to the associated strip line cells 100, respectively, and individual time slot depicts a supply timing t1 of an electric signal and a reception timing t2 of the response signal. For instance, when a supply of an electric signal corresponding to a certain set electric power and the reception of the response signal are performed in time slot n about other strip line cell 100, the supply of an electric signal corresponding to the same set electric power as a set electric power in time slot n, and the reception of the response signal are performed about the other strip line cell 100 in the next time slot n+1. In addition, the supply of an electric signal by another set electric power and the reception of the response signal are performed about the same strip line cell 100 as the strip line cell 100 of the object in time slot n in the next time slot n+2, and the supply of an electric signal by another set electric power and the reception of the response signal are performed in following time slot n+3 about other strip line cell 100. Thus, according to the present embodiment, a set of the supply of an electric signal and the reception of the response signal is alternately executed on two strip line cells 100. It can be said that such alternate execution is an execution on a simultaneous parallel basis for a user, though such alternate execution is execution to which timing shifts microscopic mutually. That is, according to the present embodiment, the performance examination to two RFID tags T1 is carried out on a simultaneous parallel basis in the appearance by using two strip line cells 100, and thus it is efficient.

Next, there will be explained a fourth embodiment of the present invention.

Figure 22:
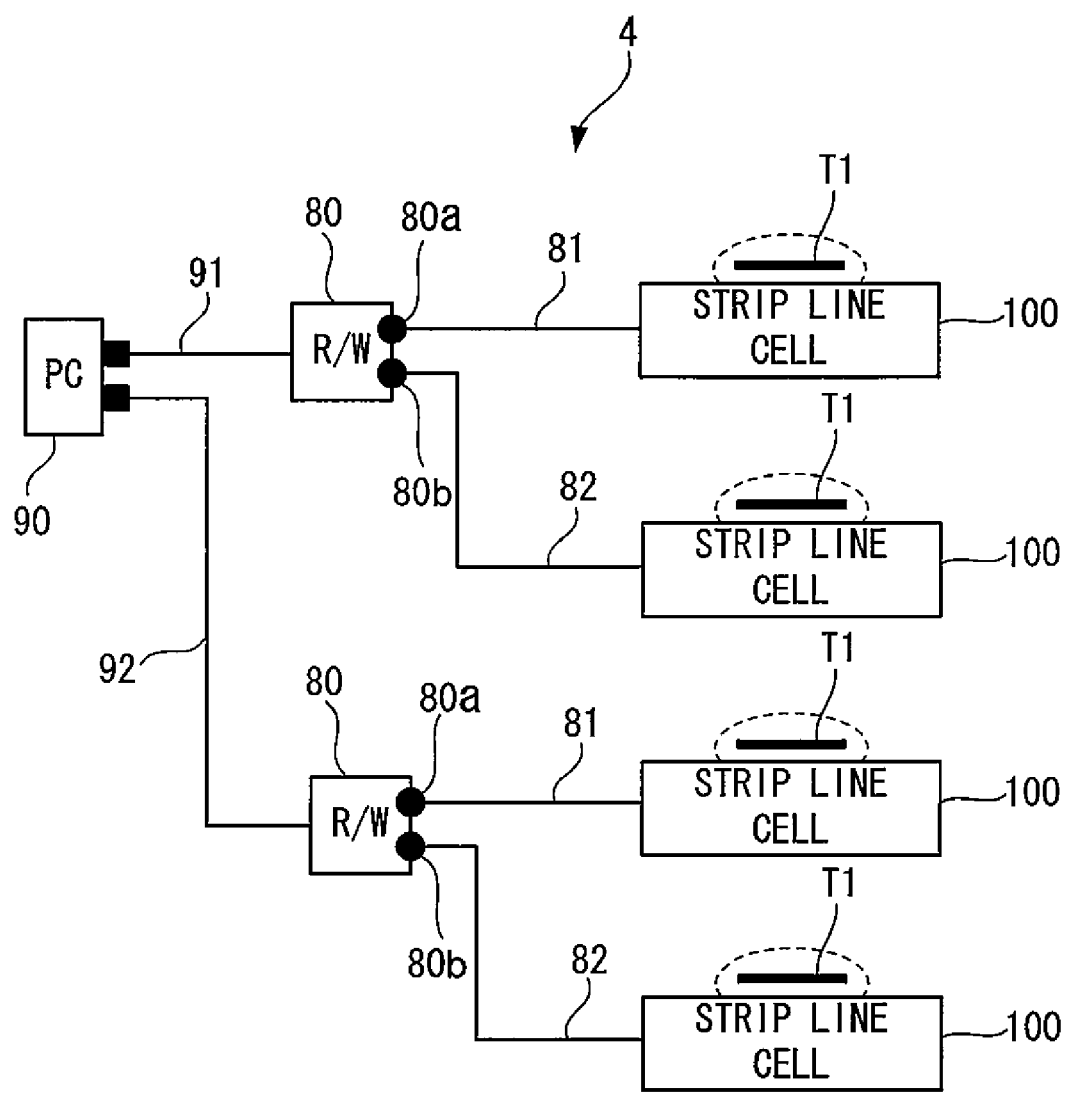
FIG. 22 is a view useful for understanding an RFID tag test apparatus according to a fourth embodiment of the present invention.

FIG. 22 is a view useful for understanding an RFID tag test apparatus according to a fourth embodiment of the present invention.

RFID tag test apparatus 4 of FIG. 22 is provided with two sets each consisting of two strip line cells 100 and the reader writer 80 which supplies an electric signal to those strip line cells 100 in the RFID tag test apparatus 3 that is the third embodiment illustrated in FIG. 20. Therefore, in FIG. 22, with respect to the same structural element as that of FIG. 20, the same reference number as FIG. 20 is applied, and, in the following, the repetition explanation of these structural elements will be omitted.

The reader writer 80 in each two above-mentioned sets corresponds to one example of the supply machine referring to in the present invention. These two reader writers 80 respectively are connected with a computer 90 through each the 9th and the tenth cables 91 and 92. The computer 90 controls two reader writers 80 so that the supply of an electric signal explained referring to FIG. 21 and the reception of the response signal are mutually performed on a simultaneous parallel basis among each reader writers 80. Therefore, according to the present embodiment, the performance examination to four RFID tags T1 is carried out on a simultaneous parallel basis by using four strip line cells 100, and thus it is further efficient.

Here, because the range where the semi-TEM wave on each strip line cell 100 reaches is limited, the interference between the strip line cells 100 and the like are avoided though the supply of an electric signal and the reception of the response signal are performed in the mutually same timing about two strip line cells 100 of these four strip line cells 100.

Next, there will be explained a fifth embodiment of the present invention.

Figure 23:
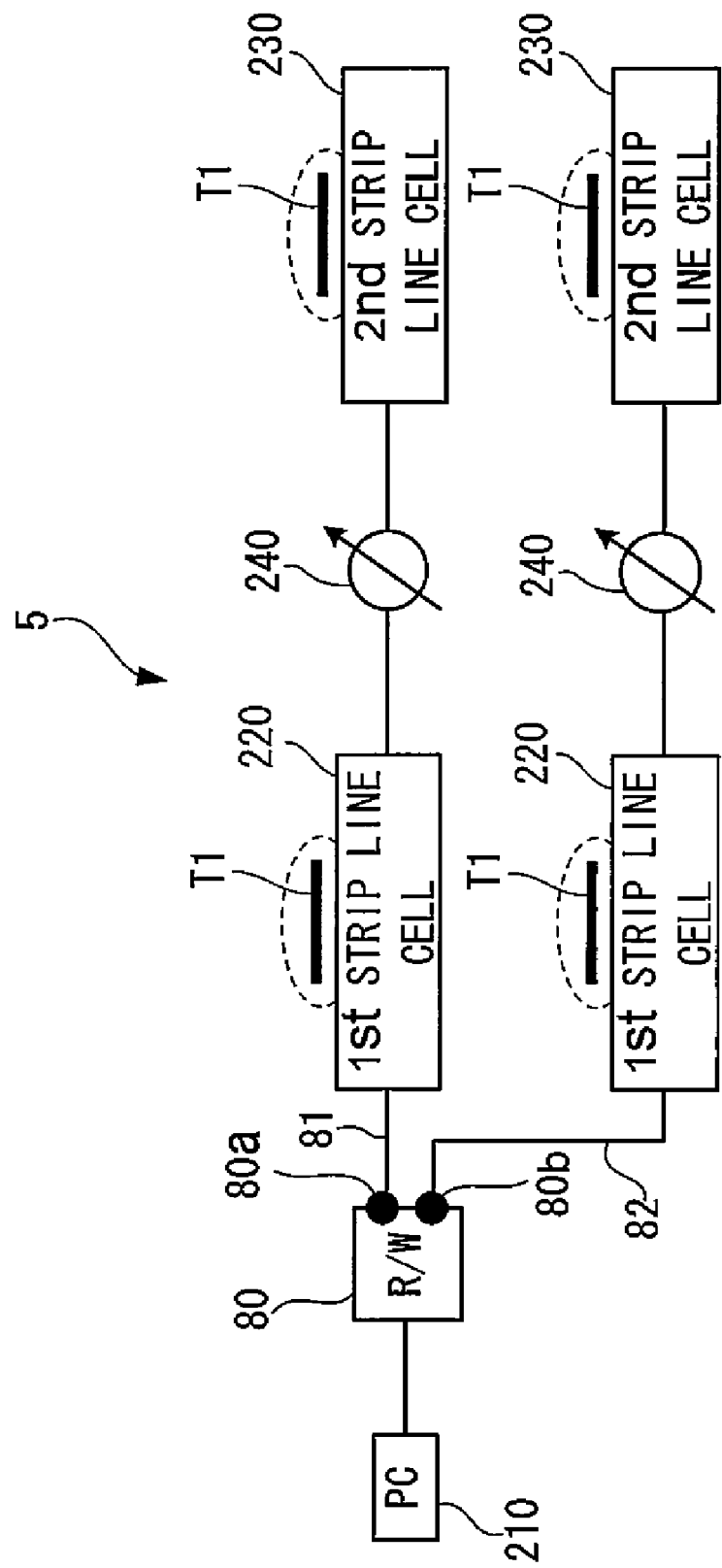
FIG. 23 is a view useful for understanding an RFID tag test apparatus according to a fifth embodiment of the present invention.

FIG. 23 is a view useful for understanding an RFID tag test apparatus according to a fifth embodiment of the present invention.

RFID tag test apparatus 5 according to the fifth embodiment is provided with the same reader writer as the reader writer 80 which the RFID tag test apparatus 3 according to the third embodiment illustrated in FIG. 20 is provided with. Therefore, in FIG. 23, with respect to the same structural element as that of FIG. 20, the same reference number as FIG. 20 is applied, and, in the following, the repetition explanation of these structural elements of the reader writer 80 will be omitted.

According to the present embodiment, first and second strip line cells 220 and 230, which are almost equal to one another, are connected in series with two port 80a and 80b of a reader writer 80 through the following attenuators 240, respectively. Here, the second strip line cell 230 of the first and second strip line cells 220 and 230 is the same as the strip line cells 100 used in the first to the fourth embodiments. However, the first strip line cell 220 is not connected the terminator resistance 103 illustrated in FIG. 4, and is of a structure that the terminal connector goes out outside the case as well as the input connector. The attenuator 240 is connected between the terminal connector of the first strip line cell 220 and the input connector of the second strip line cell 230. The attenuator 240 attenuates to a predetermined level the electric signal that the reader writer 80 supplies to the first strip line cell 220, and transmits the second strip line cell 230. The attenuator 240 corresponds to one example of the attenuation section referred to in the present invention.

The examination objects of the RFID tag test apparatus 5 according to the fifth embodiment are two or more RFID tags contained in the tag roles R as well as the RFID tag test apparatus 2 according to the second embodiment illustrated in FIG. 17. However, according to the RFID tag test apparatus 5 that is the fifth embodiment, one tag role R is examined by using the set of the strip line cells connected with one port of the reader writer 80. In other words, the RFID tag test apparatus 5 has the function of examining two tag roles R on a simultaneous parallel basis. Here, since two sets of the strip line cells connected with associated ports are equal to one another, and the examinations performed by using individual sets are also equal to one another, it explains paying attention to the other set of the two sets of the strip line cells in the following.

Figure 24:
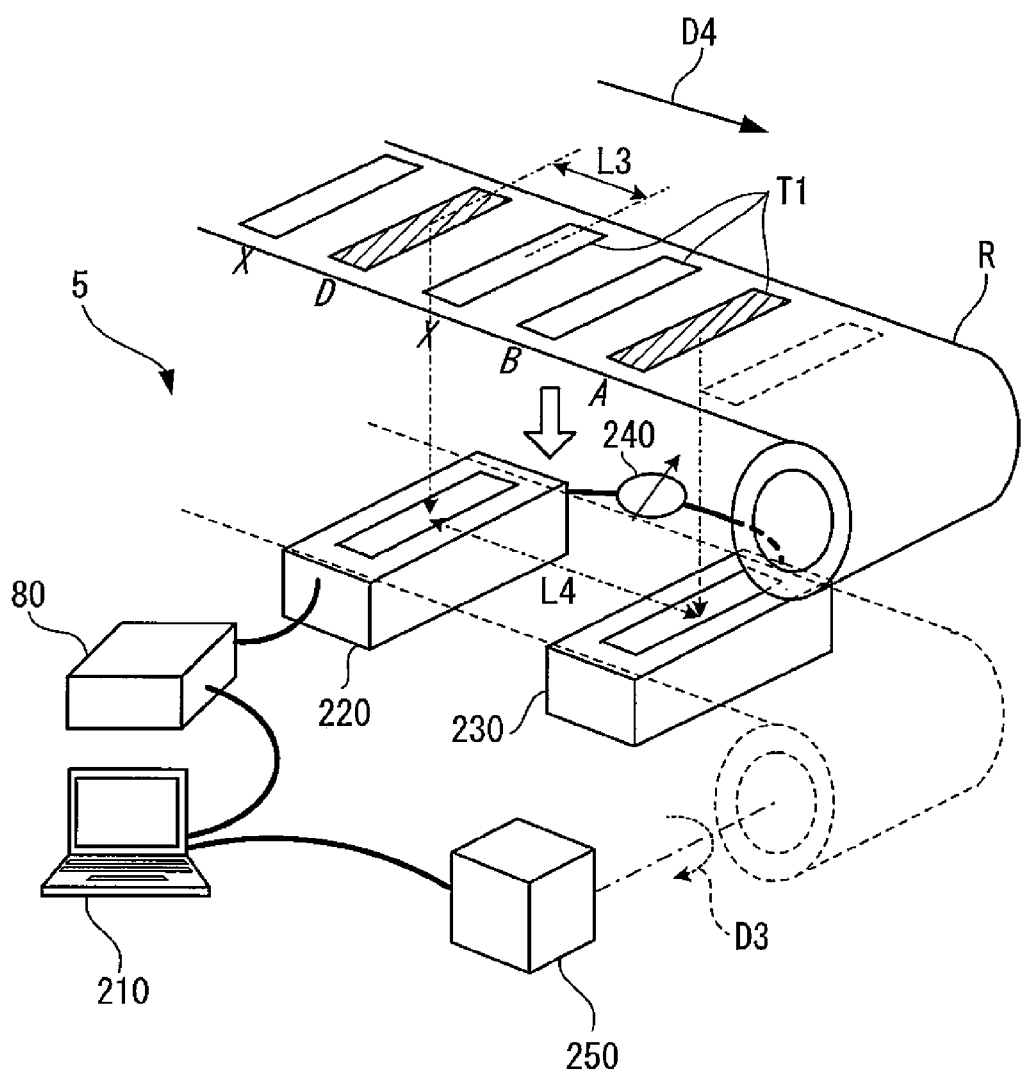
FIG. 24 is useful for understanding details of RFID tag test apparatus 5 illustrated in FIG. 23 paying attention to another one of two sets of the strip line cell.

FIG. 24 is useful for understanding details of RFID tag test apparatus 5 illustrated in FIG. 23 paying attention to another one of two sets of the strip line cell.

In FIG. 24, the tag role R to be examined is illustrated at a position away from two strip line cells 220 and 230 to make the figure easy to see. However, as seen in the figure in the dotted line, the tag role R is actually arranged to touch two strip line cells 220 and 230. Further, FIG. 24 illustrates a transportation device 250 (which is not illustrated in FIG. 23) that transports individual RFID tags T1 of the tag role R in the direction of transportation where an arrow D4 indicates by means of rotating the rotation axis of the tag role R in the direction of an arrow D3, and arranges individual RFID tags T1 in order for two strip line cells 220 and 230.

As seen from FIG. 24, according to the RFID tag test apparatus 5, two strip line cells 220 and 230 are arranged along the direction of transportation that arrow D4 indicates from the upstream side of the direction of transportation that arrow D4 indicates in order of the 1st strip line cell 220 and the 2nd strip line cell 230. In addition, interval L4 of two strip line cells 220 and 230 is three times at an arrangement interval L3 of the RFID tag T1 in the tag role R.

Figure 25:
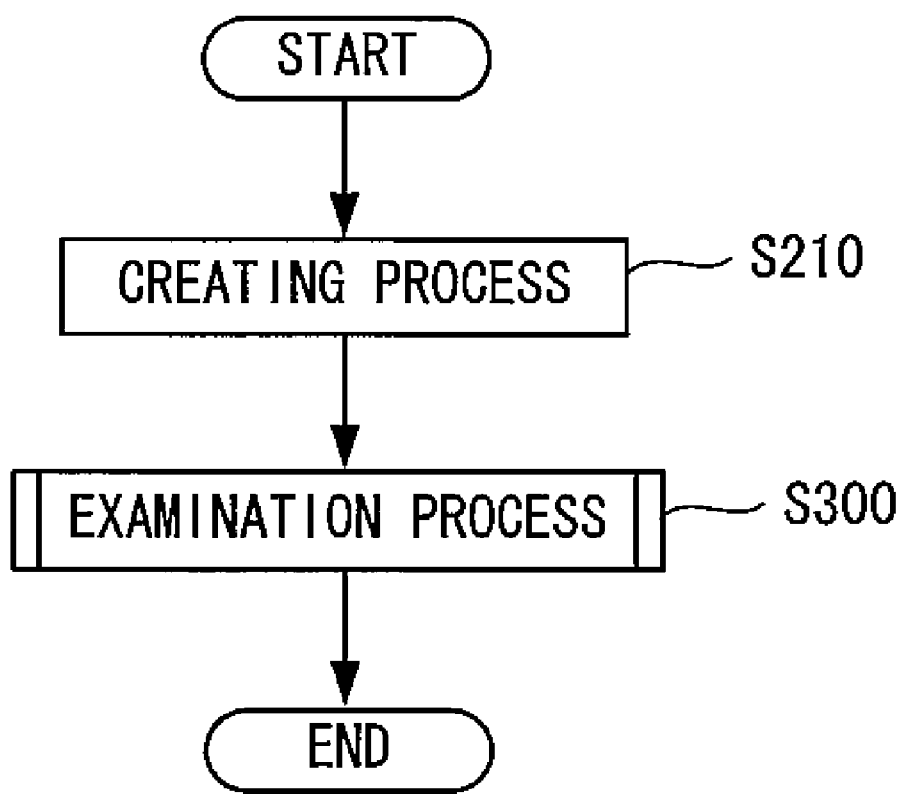
FIG. 25 is a flowchart useful for understanding a manufacturing method of the RFID tag, including the examination process of the RFID tag using RFID tag test apparatus 5 represented in FIG. 23 and FIG. 24.

FIG. 25 is a flowchart useful for understanding a manufacturing method of the RFID tag, including the examination process of the RFID tag using RFID tag test apparatus 5 represented in FIG. 23 and FIG. 24.

The method of manufacturing the RFID tag illustrated in FIG. 25 has a creating process (step S210) that is equal to the creating process illustrated in FIG. 18, and an examination process (step S300) of performing the performance examination for determining the communication limit distance of individual RFID tags T1 of the tag role R using the RFID tag test apparatus 5. The method of manufacturing the RFID tag illustrated in FIG. 25 corresponds to one embodiment of the manufacturing method of the present invention. The examination process (step S300) corresponds to one embodiment of the examination process referred to in the present invention, and also serves as one embodiment of the manufacturing method of the present invention.

Figure 26:
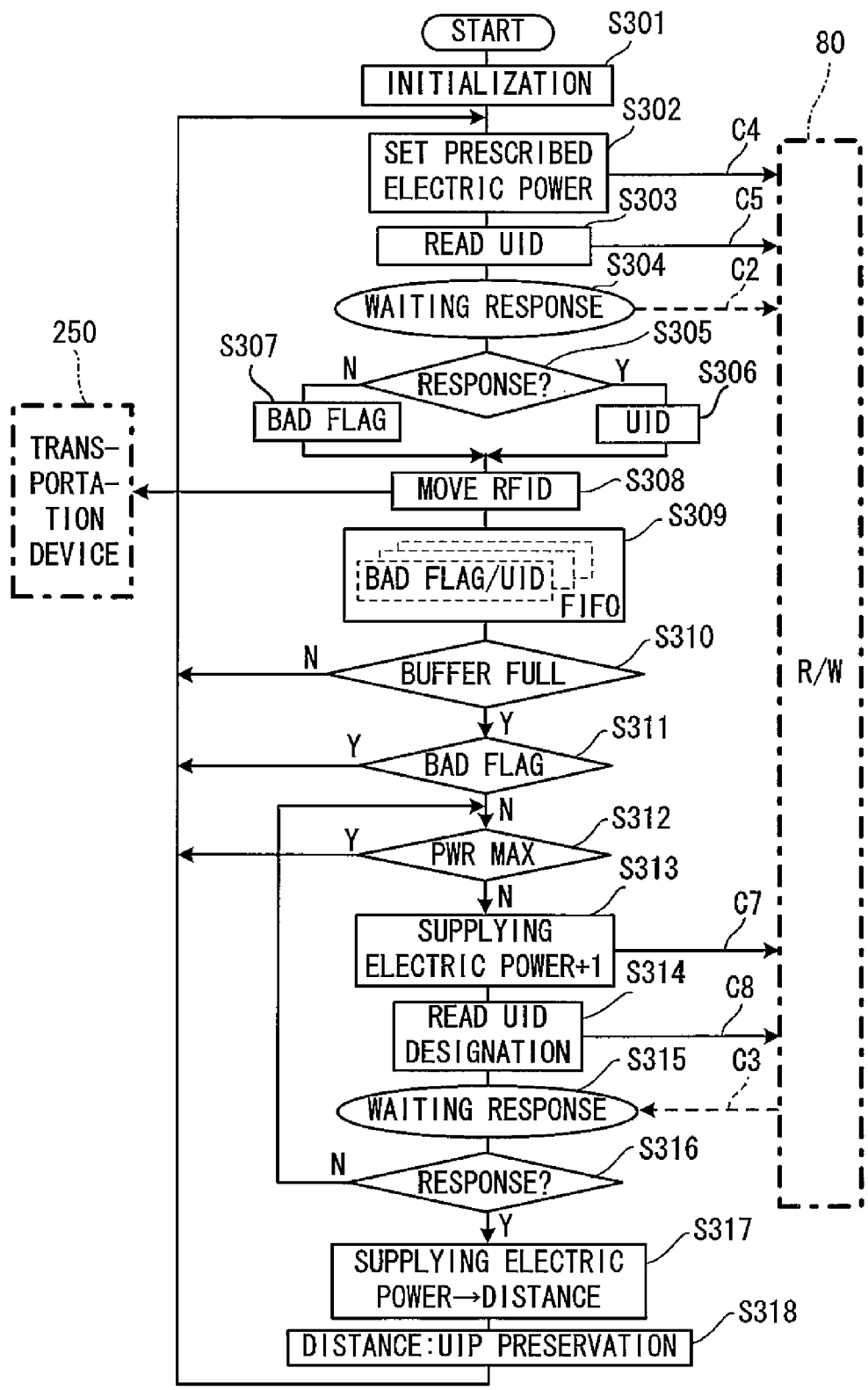
FIG. 26 is a flowchart useful for understanding a detailed flow of the examination process (step S330) in FIG. 25.

FIG. 26 is a flowchart useful for understanding a detailed flow of the examination process (step S330) in FIG. 25.

The processing of the flow chart of FIG. 26 starts when the tag role R is set to the RFID tag test apparatus 5 illustrated in FIG. 23 and FIG. 24, and then the user directs the computer 210 the start of the performance examination through a predetermined operation. First of all, when the processing starts, the computer 210 directs the reader writer 80 the execution of the above-mentioned initialization (step S301).

Next, there is sent command C4 that directs the reader writer 80 such an assumption that a set value of the electric power is a set value wherein the radio wave signal is sent by the output in which the RFID tag T1 can be received on the first strip line cell 220, and the set value of the electric power is a set value wherein the radio wave signal is sent by a low output in which the RFID tag T1 cannot be received on the second strip line cell 230 wherein an electric signal is transmitted through the attenuator 240 (step S301). Subsequently, there is sent to the reader writer 80 command C5 that directs the effect to supply the first demand signal that demands UID from RFID tag T1 to be examined to the first strip line cell 220 (step S302). Processing of a combination of the processing of the step S302 and the processing of the step S301 corresponds to one example of the supply process referred to in the present invention. Moreover, the UID of the present embodiment corresponds to one example of the identification information referred to in the present invention. The computer 210 that acquires response signal S2 representative of the UID corresponds to one example of the identification information obtaining section referred to in the present invention.

The reader writer 80 supplies to the first strip line cell 220 the first demand signal having the electric power which is set as mentioned above. Moreover, the first demand signal is also supplied to the second strip line cell 230 through the attenuator 240. At that time, because the electric power of the first demand signal is set to a set value as mentioned above, only the RFID tag T1 arranged for the first strip line cell 220 becomes possible to receive the radio wave signal according to the first demand signal. When the response signal S2 from the RFID tag T1 is transmitted, the reader writer 80 receives the response signal S2 through the first strip line cell 220 and sends it to the computer 210.

On the other hand, as for the computer 210, it shifts to the stand-by state after step S303 (step S304), and it is judged whether the response signal S2 is sent by the reader writer 80 afterwards (step S305). When the response signal S2 is sent by the reader writer 20 (Yes judgment in step S305), UID represented by the response signal S2 is temporarily stored in a predetermined memory (step S306). When the response signal S2 is not sent by the reader writer 20 (No judgment in step S305), BAD flag that represents so is temporarily stored (step S307).

When the temporary storage of UID (step S306) or the temporary storage of the BAD flag (step S307) ends, the computer 210 sends to the transportation device 250 command C6 that directs to rotate a center axis of tag role R by the angle that corresponds to the transportation on the arrangement interval L3 (step S308). After the transmission of the command C6, the computer 210 stores UID or BAD flag, which is temporarily stored, into the FIFO memory where information is stored by first-in first-out, which the computer 210 is provided with (step S309). The FIFO memory corresponds to one example of the FIFO memory referred to in the present invention.

Here, the number of buffer stages of the FIFO memory, that is, the number of data which FIFO memory can store, is the transportation frequencies for RFID tag T1 to move from the first strip line cell 220 to the second strip line cell 230. According to the present embodiment, as understood from FIG. 24, the number of buffer stages of the FIFO memory is set to three stages since the transportation frequency is three times.

When the storage of information into the FIFO memory ends in step S309, it is judged whether the buffer of the FIFO memory is filled now (step S310). When there is becoming empty (No judgment in step S310) in the buffer, processing returns up to step S302 to repeat the processing from step S302 to step S310. This processing is continued until the buffer of the FIFO memory is filled (Yes judgment in step S310).

When the buffer of the FIFO memory is filled, information is read from the FIFO memory and it is judged whether the information is the BAD flag (step S311). When the information is the BAD flag (Yes judgment in step S311), processing returns up to step S302 and processing from step S302 to step S311 is repeated.

On the other hand, when the information is not BAD flag but UID (No judgment in step S311), it is judged whether the electric power of the electric signal set in the reader writer 80 is the maximum set value now (step S312). Because a set value of the electric power is not maximum set value (No judgment in step S312) immediately after the judgment by step 311, the processing advances to the next step S313.

In the processing of step S313, as a set value of the electric power in the reader writer 80, there is computed a value where a present set value is increased by increment of a predetermined interval, and command C7 that directs to set the computing result to the electric power of the electric signal supplied to the first strip line cell 220 is sent to the reader writer 80. Next, command C8 that directs the effect to supply the second demand signal that demands a predetermined reaction from the RFID tag T1 that UID read from the FIFO memory identifies to the first strip line cell 220 is sent to reader writer 80 (step S314). Processing of a combination of the processing of the step S314 and the processing of the step S313 corresponds to one example of the supply process referred to in the present invention, too.

The reader writer 80 supplies the second demand signal having the electric power set as mentioned above to the first strip line cell 220. The second demand signal is supplied to the second strip line cell 230 through the attenuator 240. As for the RFID tag T1 by which the second demand signal demands the reaction, it is arranged at the position of the second strip line cell 230 at the time point that the second demand signal is supplied to the first strip line cell 220 in such a manner that the repetition of transportation by step S308 is carried out three times after the response signal S2 indicative of UID at the position of the first strip line cell 220 is transmitted. At that time, another RFID tag T1 that is different in UID from this RFID tag T1 is arranged at the position of the first strip line cell 220. Therefore, it becomes only RFID tag T1 at the position of the second strip line cell 230 which is involved in a possibility of reacting to the second demand signal though the second demand signal is sent from both the first and the second strip line cells 220 and 230.

As for the computer 210, it shifts to the stand-by state after step S314 (step S315), and it is judged afterwards whether the response signal S3 based on the reaction of the RFID tag T1 is sent from the reader writer 80 (step S316). Processing of a combination of the processing of step S316 and the processing of step S315 corresponds to one example of the reaction confirmation process referred to in the present invention.

When the response signal S3 is not sent by the reader writer 80 (No judgment in step S316), the process returns up to step S312, and processing from step S312 to step S316 is repeated. This repetition is continued until a set value of the electric power reaches the maximum set value (Yes judgment in step S312) or the response signal S3 is sent by the reader writer 80 (Yes judgment in step S316).

When the response signal S3 is sent by the reader writer 80, the computer 210 converts a set value of the electric power when the response signal is sent into the communication limit distance by using the relation of electric power vs. distance mentioned above (step S317), associates the communication limit distance with UID that becomes the base of the second demand signal, and preserves it in a predetermined memory (step S318). When the preservation of the communication limit distance through step S318 ends or a set value of the electric power reaches the maximum setting value without sending the response signal S3 (Yes judgment in step S312), processing returns up to step S302 and the examination is continued.

There will be explained the examination process explaining referring to the flow chart of FIG. 26 further referring to FIG. 24 and FIG. 27 though some of the examination process explaining referring to the flow chart of FIG. 26 becomes a repetition.

Figure 27:
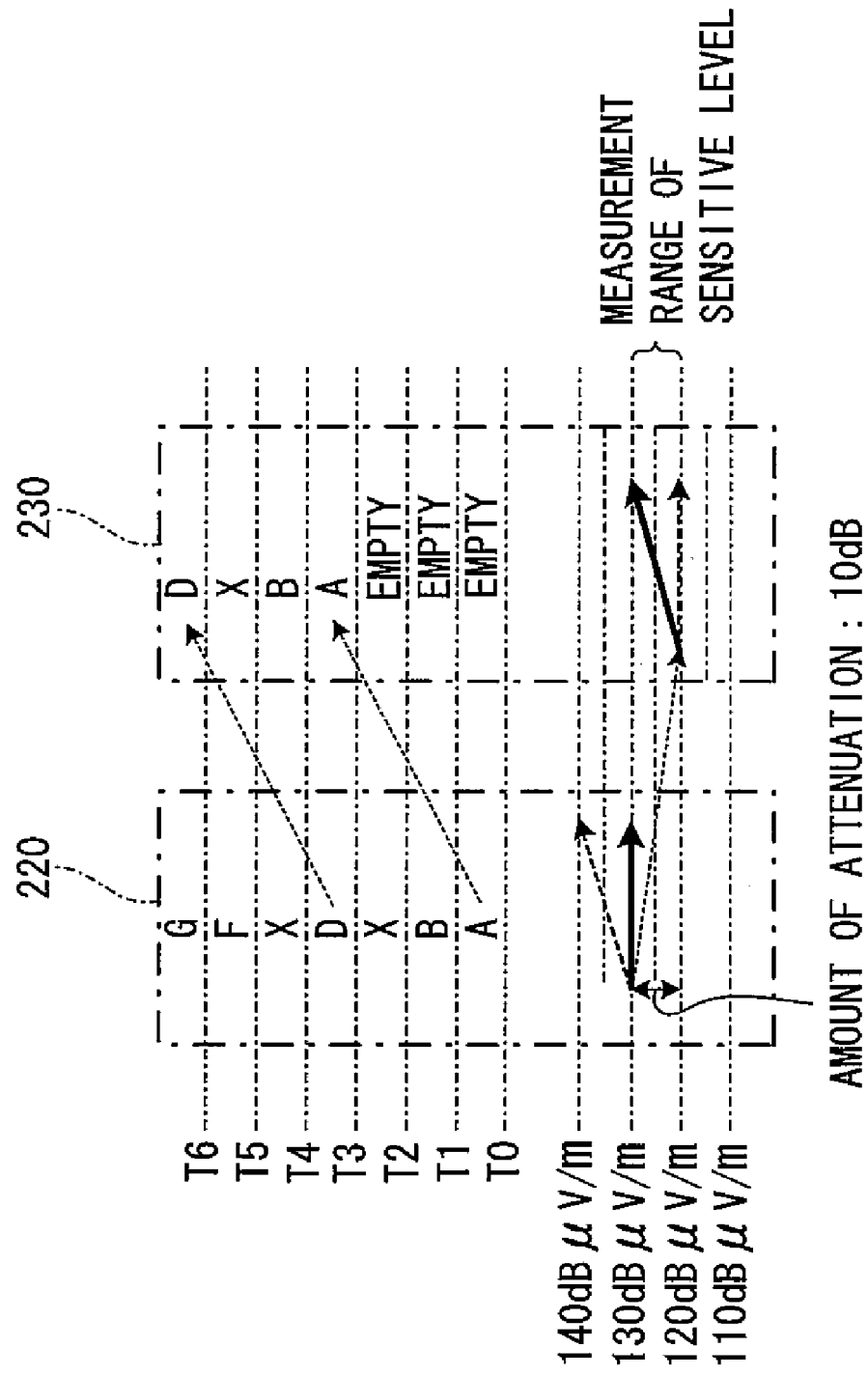
FIG. 27 illustrates an arrangement of RFID tag T1 on the first and second strip line cells 220 and 230 and outputs of the radio wave signals that are transmitted from individual strip line cells.

FIG. 27 illustrates an arrangement of RFID tag T1 on the first and second strip line cells 220 and 230 and outputs of the radio wave signals that are transmitted from individual strip line cells.

As seen from FIG. 24, RFID tags T1 of the tag role R are called tag A, tag B, tag X, tag D, and tag X from transportation direction (arrow D4) downstream side. Here, it is assumed that both of two tags X are the breakdown goods. It is assumed that the above-mentioned examination process starts when the tag role R is set to the RFID tag test apparatus 5 in such a way that the tag A is arranged at the position of the first strip line cell 220. In this case, the position of the second strip line cell 230 is an empty state at the start time T0 of the examination process as illustrated in FIG. 27.

Here, when it is assumed that the electric field strength in the radio wave signal wherein the first strip line cell 220 sends based on the first demand signal that demands UID supplied by the reader writer 80 is 130 dBμV/m for instance, and the amount of attenuation with the attenuator 240 is 10 dB, the electric field strength in the radio wave signal wherein the second strip line cell 230 sends based on the first demand signal after the attenuation becomes 120 dBμV/m. At that time, if the minimum electric field strength with which the RFID tag T1 to be examined is operative is 125 dBμV/m, the tag A arranged at the position of the first strip line cell 220 transmits the response signal at the time point T0. Such processing keeps being executed until time point T3 that tag A is arranged at the position of the second strip line cell 230, the radio wave signal that has electric field strength of 130 dBμV/m being sent meanwhile by the first strip line cell 220, and the radio wave signal that has electric field strength of 120 dBμV/m keeps being sent by the second strip line cell 230. At the time point T3, the radio wave signal having the electric field strength of 120 dBμV/m is sent to the tag A arranged at the position of the second strip line cell 230. However, the tag A becomes no reactive, because the electric field strength of the radio wave signal is below the minimum electric field strength with which the tag A is operative. After the time point T3, the RFID tags T1 are arranged at both positions of two strip line cells 220 and 230, and the radio wave signal will be sent to both of these two RFID tags. However, the radio wave signal based on the first demand signal that demands UID comes to be received only with RFID tag T1 arranged at the position of the first strip line cell 220.

Next, after the time point T3, following the processing based on the first demand signal, processing based on the second demand signal that specifies the UID is executed while increasing the electric power gradually, that is, increasing the electric field strength of the radio wave signal that the each strip line cell sends. At the time of the start of this processing, the first strip line cell 220 sends the radio wave signal that has electric field strength of 130 dBμV/m and the second strip line cell 230 sends the radio wave signal that has electric field strength of 120 dBμV/m. As mentioned above, according to this example, the minimum electric field strength with which RFID tag T1 is operative is 125 dBμV/m, and thus RFID tag T1 at the position of the first strip line cell 220 is operative at any time while processing it. However, processing that specifies this UID is carried out by using the acquired UID when RFID tag T1 from which UID is acquired is arranged at the position of the second strip line cell 230. Therefore, RFID tag T1 at the position of the first strip line cell 220 is a disagreement in UID, and thus it becomes no reactive. Here, when it is assumed that an increment in electric field strength is 10 dB in the maximum, electric field strength of the radio wave signal that the second strip line cell 230 generates changes from 120 dBμV/m to 130 dBμV/m in the maximum while processing it. When electric field strength of the radio wave signal reaches 125 dBμV/m that is strength with which RFID tag T1 is operative, if RFID tags T1 arranged at the position of the second strip line cell 230 at that time are normal tags (in the example here, tag A, tag B, tag C, and tag D), those tags come to react, and the communication limit distances of those RFID tags T1 are determined.

According to the fifth embodiment explained referring to FIG. 23 to FIG. 27 above, the performance examination for determining the communication limit distance is carried out through specifying UID, and thus it is possible to evade such trouble that other RFID tag T1 that exists near RFID tag T1 while examining the performance reacts by mistake, so that a more accurate examination can be done.

Next, there will be explained the sixth embodiment of the present invention.

Figure 28:
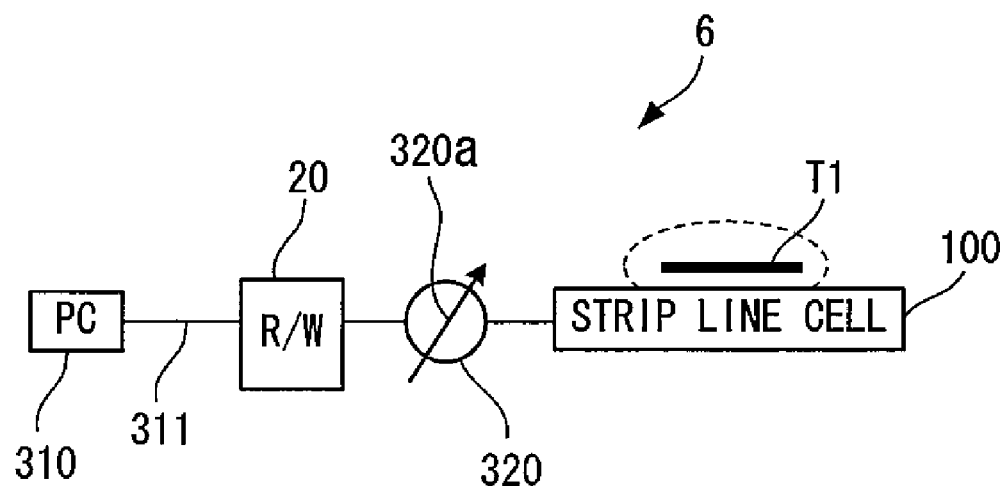
FIG. 28 is a view useful for understanding an RFID tag test apparatus according to a sixth embodiment of the present invention.

FIG. 28 is a view useful for understanding an RFID tag test apparatus according to a sixth embodiment of the present invention.

RFID tag test apparatus 6 of FIG. 28 has reader writer and strip line cell which are equal to the reader writer 20 and the strip line cell 100 in the first embodiment of FIG. 1. In FIG. 28, the same reference number as FIG. 1 is fixed to these reader writer and strip line cell, and, in the following, the repetition explanations of these will be omitted.

Reader writer 20 is connected with a computer 310 through the 11th cable 311, and, in addition, the reader writer 20 is connected with strip line cell 100 through a variable attenuator 320 that can change the amount of attenuation by the manual operation with a predetermined handler 320a. Here, the variable attenuator 320 corresponds to one example of the transmission section referring to in the present invention.

The computer 310 transmits the command directed for the reader writer 20 to supply a demand signal to demand a predetermined reaction to the strip line cell 100 with a predetermined set electric power such as 27 dBm for instance. The electric signal, which is supplied by the reader writer 20 according to the command, is transmitted to the strip line cell 100 through the attenuation by the variable attenuator 320. The computer 310 is notified by the reader writer 20 whether RFID tag T1 to be examined reacts to the radio wave signal that the strip line cell 100 transmits based on an electric signal after the attenuation. As a result of the notification, it is displayed in a display screen (not illustrated) of the computer 310.

Two or more scales that are indicative of mutually different amounts of attenuation are put on the variable attenuator 320, and adjacent to the scale of the amount of attenuation, there are put scales of two or more distances that are indicative of mutually different distances, wherein the scale of the distance represents the distance in the RF anechoic chamber 41 of FIG. 12 from the antenna 46, which is used by the preliminary work in the first embodiment. When the user sets the handler 320a to the scale of either of distance, the electric power of the electric signal that the reader writer 20 supplies is converted into an electric power necessary for sending with the strip line cell 100 the radio wave signal of the output equal to the output of the radio wave signal in the distance that is represented by the set scale, and then be transmitted to the strip line cell 100.

Here, the scale of the distance in the variable attenuator 320 is the one put on the variable attenuator 320 through the following procedures. First of all, in a similar fashion to the preliminary work in the first embodiment, there is determined the association between a distance from the antenna 46 and the electric field strength in the distance by the measurement work in the RF anechoic chamber 41 illustrated in FIG. 12.

Figure 29:
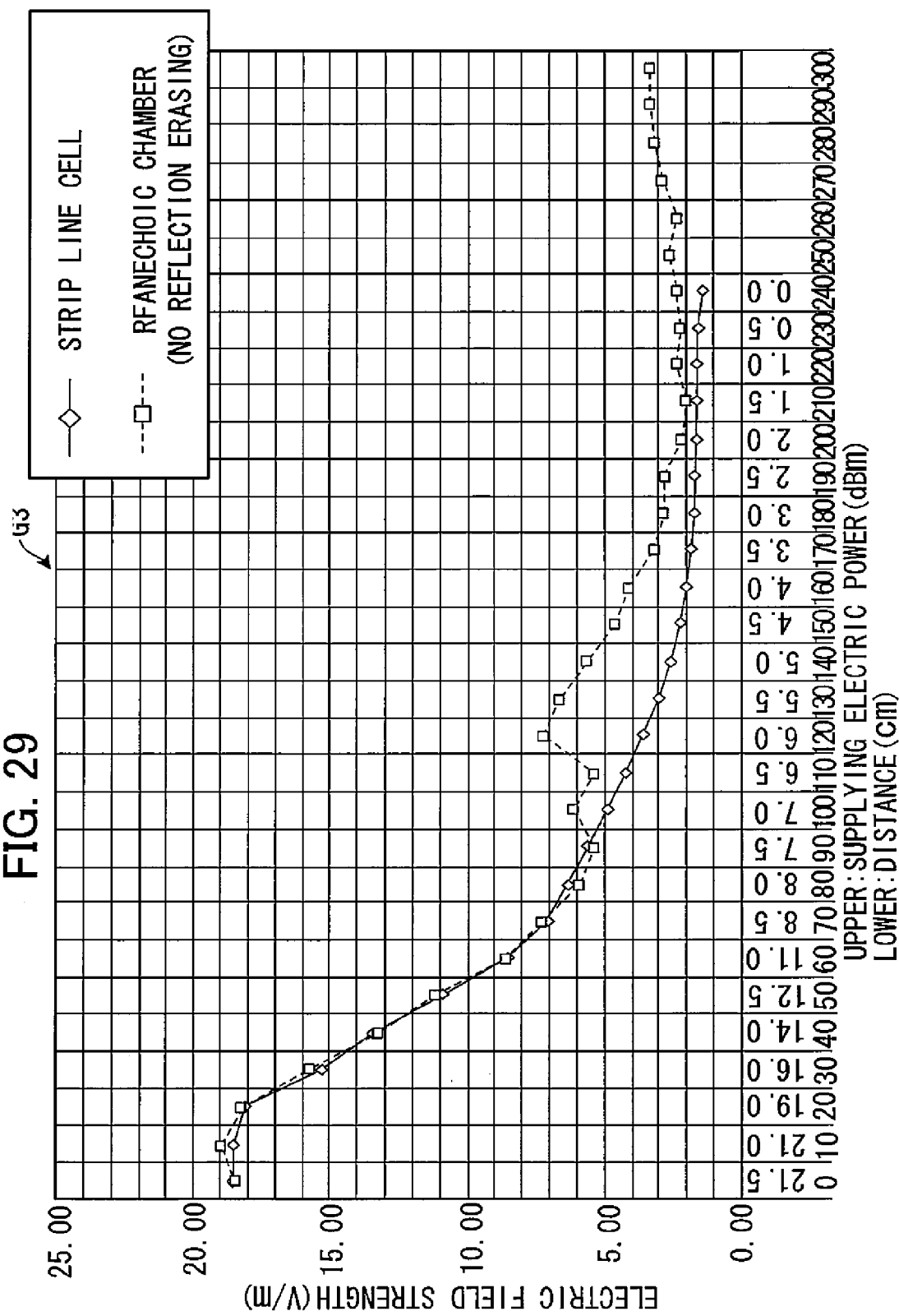
FIG. 29 is a graph used in work to determine the scale of the distance of a variable attenuator 320.

FIG. 29 is a graph used in work to determine the scale of the distance of a variable attenuator 320.

In the graph of FIG. 29, the vertical axis denotes the electric field strength, and the horizontal axis denotes the distance.

In the work to determine the scale of the distance, first of all, when there is determined the association between a distance from the antenna 46 and the electric field strength in the distance by the measurement work in the RF anechoic chamber 41, the association is plotted in graph G3. According to the example of FIG. 29, the association is plotted in the quadrangle. Next, the reader writer 20 supplies an electric signal to the strip line cell 100 in the RFID tag test apparatus 6 in the state that the scale of the distance is not put on the variable attenuator 320 as stated above by a predetermined set electric power such as 27 dBm for instance. At that time, there is determined the scale of the amount of attenuation to obtain electric field strength that is almost equal to the electric field strength of the plot point regarding a quadrangle each plot point in graph G3 by operating the handler 320a of the variable attenuator 320 while measuring electric field strength in the radio wave signal transmitted from the strip line cell 100 with the use of a standard dipole antenna. In the example of FIG. 29, the scale of the amount of attenuation determined on the plot point corresponding to the distance is put on the upper part of each distance in the horizontal axis in graph G3. In addition, in graph G3, the association between the scale of the amount of attenuation obtained by operating the variable attenuator 320 and the electric field strength are plotted in the diamond. In graph G3, there is seen the part where two kinds of plot points are not so corresponding. This is because the association between the distance and the electric field strength plotted in the quadrangle contains the error margin owing to the reflection in the RF anechoic chamber 41 and the like. Actually, there is performed a correction that such an influence is excluded from the association between the distance and the electric field strength determined by the measurement, and the association after the correction as plotted with the quadrangle in graph G2 illustrated in FIG. 15 for instance is used.

When a scale of the amount of attenuation corresponding to the distance from the antenna 46 is determined through the work as explained above, the distance corresponding to the scale is described in adjacent to the scale of the amount of attenuation in the variable attenuator 320. As a result, the variable attenuator 320 to which the scale of the distance is described is obtained, so that RFID tag test apparatus 6 of FIG. 28 is completed.

The user installs RFID tag T1 to be examined in the strip line cell 100 of the completed RFID tag test apparatus 6, and operates the handler 320a while watching and confirming the display of the presence of the response of the computer 310 in the display screen, so that the user adopts the scale of the distance when the reaction appears first when the electric field strength is increased, or the scale of the distance when the reaction disappeared first when the electric field strength is decreased, as a communication limit distance of the RFID tag T1.

As mentioned above, according to the sixth embodiment, it is possible to determine the communication limit distance of RFID tag T1 to be examined by an easy manual operation.

Next, there will be explained the seventh embodiment of the present invention.

Figure 30:
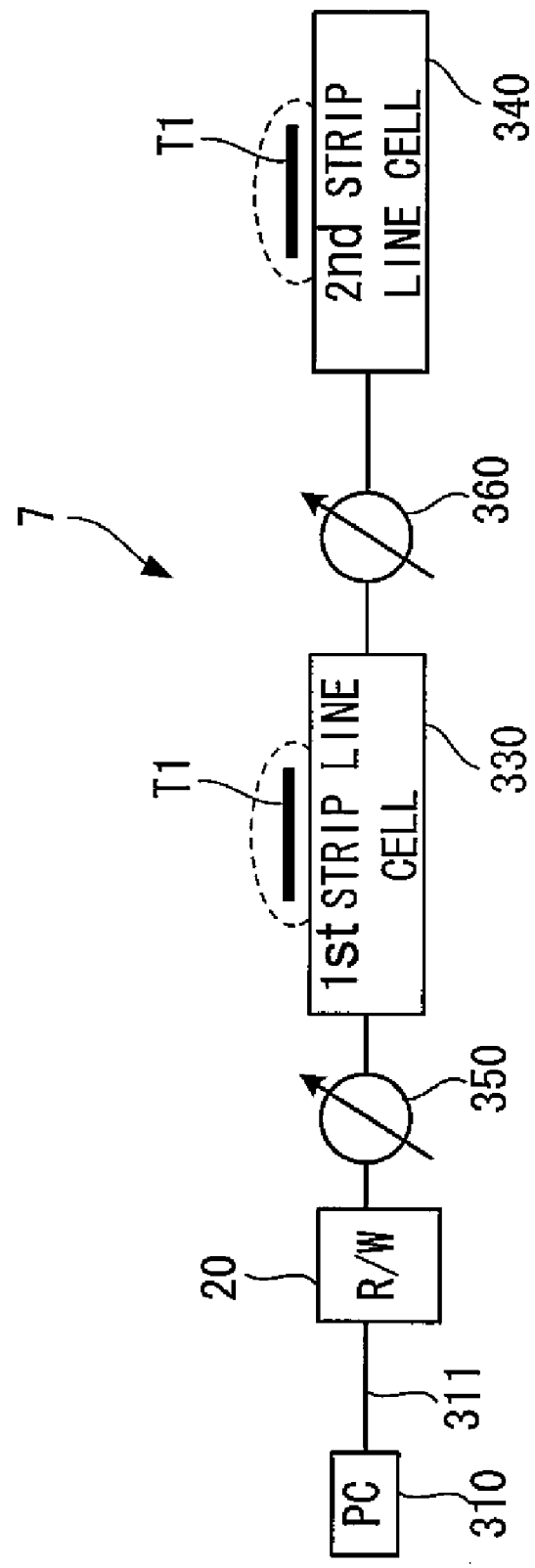
FIG. 30 is a view useful for understanding an RFID tag test apparatus according to a seventh embodiment of the present invention.

FIG. 30 is a view useful for understanding an RFID tag test apparatus according to a seventh embodiment of the present invention.

The RFID tag test apparatus 7 of FIG. 30 is equal to the RFID tag test apparatus 6 according to the sixth embodiment excepting such a point that there are prepared the first and the second strip line cells 330 and 340 which are equal to the strip line cell 100 in the sixth embodiment of FIG. 28, and the first and the second variable attenuators 350 and 360 where only the scale of the amount of attenuation is described though it is equal to the variable attenuator 320 according to the sixth embodiment. Then, in FIG. 30, the same reference numbers as FIG. 28 are applied to the same components as that of FIG. 28, and, in the following, the repetition explanation of these components will be omitted in FIG. 30.

In the RFID tag test apparatus 7 of FIG. 30, the first variable attenuator 350 is connected between the reader writer 20 and the first strip line cell 330, and the second variable attenuator 360 is connected between two strip line cells 330 and 340. The first strip line cell 330 and the second strip line cell 340 correspond to one examples of the first strip line cell and the second strip line cell referred to in the present invention, respectively, and the first variable attenuator 350 and the second variable attenuator 360 correspond to one examples of the transmission section and the second transmission section referred to in the present invention, respectively.

The RFID tag test apparatus 7 of FIG. 30 is operated for instance as follows.

For instance, generally, the RFID tag has the tolerance of electric field strength permitted in reception such that the radio wave signal that has electric field strength more than predetermined lower bound electric field strength can be received, and if it is up to predetermined upper bound electric field strength in addition, the radio wave signal can be received without damaging it. Then, the performance examination of confirming whether RFID tag T1 to be examined certainly has the tolerance of such electric field strength is performed.

First of all, in the RFID tag test apparatus 7 of FIG. 30, the computer 310 directs the reader writer 20 to set the electric power to a set value that exceeds a set value that requires it so that the first strip line cell 330 may transmit the radio wave signal of upper bound electric field strength. And, the amount of attenuation of the first variable attenuator 350 is set to the amount of attenuation in which the radio wave signal of upper bound electric field strength is generated on the first strip line cell 330, and the amount of attenuation of the second variable attenuator 360 is set to the amount of attenuation in which the radio wave signal of lower bound electric field strength is generated on the second strip line cell 330. And, the user staggers the RFID tag T1 to be examined from the first strip line cell 330 and the second strip line cell 340 and confirms the presence of the RFID tag T1 reaction on a display screen (not illustrated) of the computer 310 while exposing it to the radio wave signal from each strip line cell.

According to the RFID tag test apparatus 7 of the seventh embodiment, it is possible to easily confirm whether the RFID tag T1 to be examined certainly has the above-mentioned tolerance by a series of work as mentioned above.

Next, there will be explained an eighth embodiment of the present invention.

Figure 31:
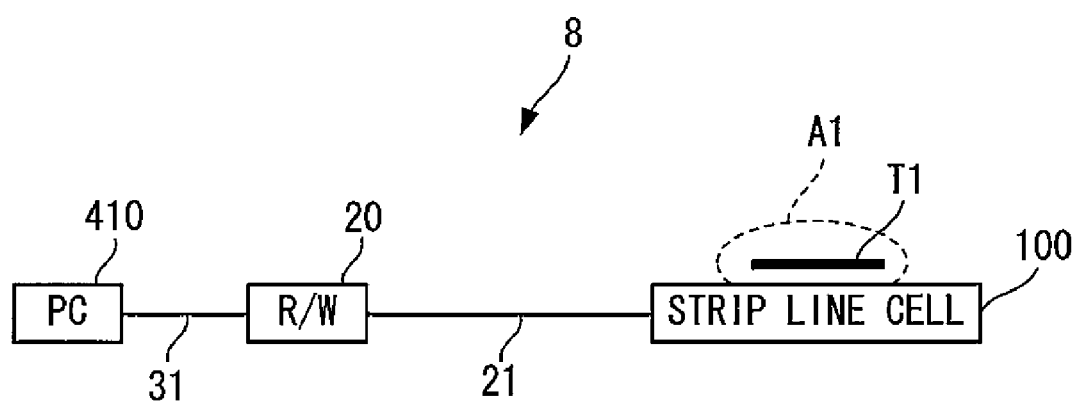
FIG. 31 is a view useful for understanding an RFID tag test apparatus according to an eighth embodiment of the present invention.

FIG. 31 is a view useful for understanding an RFID tag test apparatus according to an eighth embodiment of the present invention.

RFID tag test apparatus 8 of FIG. 31 is equal to the RFID tag test apparatus 1 according to the first embodiment of FIG. 1 excepting the point that the RFID tag test apparatus 8 is an apparatus for obtaining the frequency characteristic defined as the association between the frequency of the radio wave signal and the communication limit distance in the RFID tag. Therefore, in FIG. 31, the same reference numbers as FIG. 1 are fixed regarding equal components to FIG. 1, and, in the following, the repetition explanation of these components will be omitted.

Here, there will be explained the necessity of the acquisition of the frequency characteristic of the RFID tag.

As mentioned above, it is often that the RFID tag is installed in various articles and used. As a result, the radio wave signal that the RFID tag receives might be reached through such an article to the RFID tag. When the RFID tag is installed in the article, the covering that covers the entire RFID tag for the protection of the RFID tag might be provided. It is known that the frequency of the radio wave signal changes by the influence of the relative permittivity etc. of the object that exists in the propagation path. Then, the RFID tag to which use under the environment with the influence like this for the radio wave signal is assumed is designed in such a manner that the maximum antenna gain in the assumed communication frequency is obtained in expectation of the influence by the used environment. Therefore, when such RFID tag is manufactured, it is necessary to verify whether the manufactured RFID tag has the frequency characteristic like the expectation in the design, and the acquisition of the frequency characteristic is indispensable.

The RFID tag test apparatus 8 of FIG. 31 is an apparatus for obtaining the frequency characteristic, and the performance examination explained referring to FIG. 16 is executed on each frequency that ranges from 800 MHz to 1040 MHz including 953 MHz that is the communication frequency of RFID tag T1. According to the present embodiment, it is achieved because the computer 410 controls the reader writer 20 along the flow of the processing described later. The computer 410 corresponds to one example of the reaction confirmation section referred to in the present invention.

Incidentally, in order that such an examination may become possible, it is preferable that the output of the strip line cell that transmits the radio wave signal aiming at the RFID tag is stabilized extending over the above-mentioned range of the frequency. Here, it is confirmed by the experiment that the output characteristic to the frequency of the strip line cell 100 used also in the present embodiment and other embodiments is stabilized.

Figure 32:
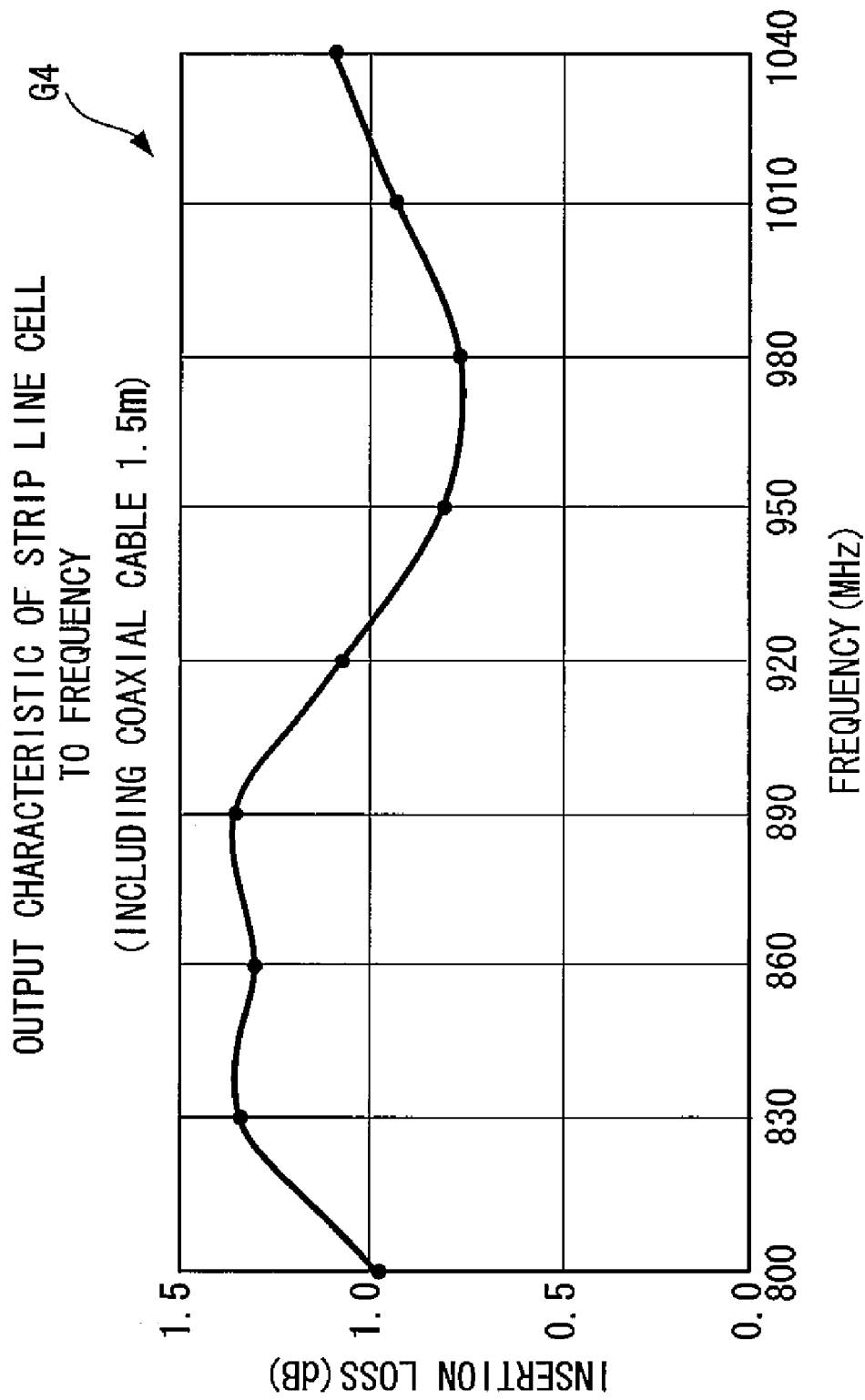
FIG. 32 is a graph of frequency characteristics of the strip line cell 100.

FIG. 32 is a graph of output characteristics to frequency of the strip line cell 100.

In graph G4 of FIG. 32, a vertical axis denotes the insertion loss, and a horizontal axis denotes the frequency. The insertion loss indicates the amount of attenuation of the output to the input, and it is possible to read it in a different way as the output of the strip line cell 100. In graph G4, there is described the change of the insertion loss extending over the range of the frequency from 800 MHz to 1040 MHz. As will be seen from FIG. 32, the insertion loss on the strip line cell 100 is stabilized before and behind about "1.0" extending over this range of the frequency, and thus it can be said that the output of the strip line cell 100 is stabilized extending over the above-mentioned range of the frequency.

According to the present embodiment, the frequency characteristic of RFID tag T1 is acquired as follows by the use of the strip line cell 100 that has a stabilized output characteristic for the frequency like this.

Figure 33:
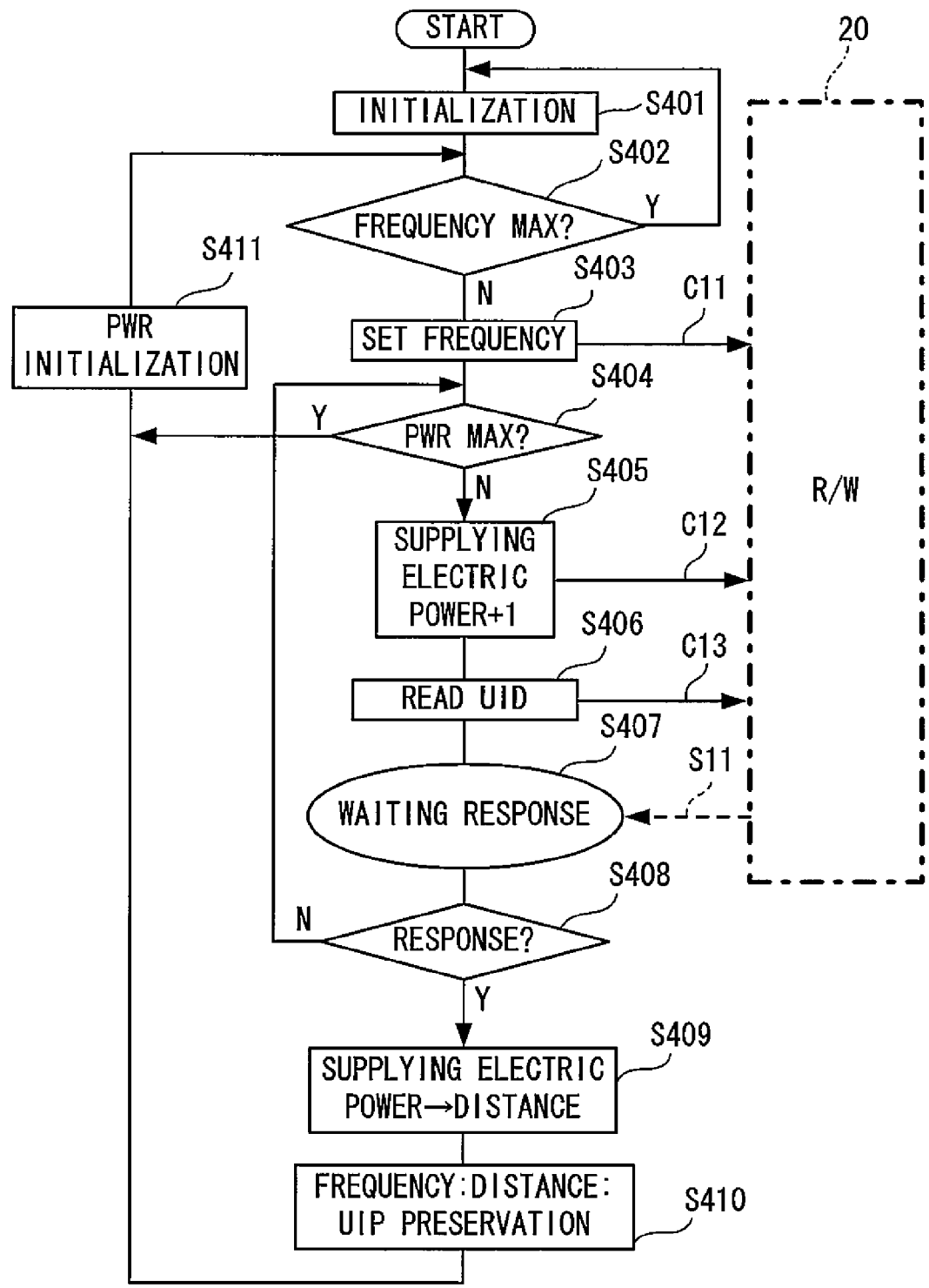
FIG. 33 is a flowchart useful for understanding a flow of the frequency characteristics acquisition processing to be executed with the RFID tag test apparatus 8.

FIG. 33 is a flowchart useful for understanding a flow of the frequency characteristics acquisition processing to be executed with the RFID tag test apparatus 8.

The processing according to the flowchart of FIG. 33 also corresponds to one embodiment of the test method of the present invention.

The processing according to the flowchart of FIG. 33 starts when the user directs the computer 410 the start of the performance examination through a predetermined operation. When it starts the processing, first, the computer 410 sets the electric power of the electric signal to be supplied to the strip line cell 100 to 0 dBm for the reader writer 20, and the computer 410 sets the frequency to 770 MHz. In addition, after the execution of the initialization is directed, it becomes a stand-by state (step S401). When RFID tag T1 to be examined is arranged on the strip line cell 100 of the RFID tag test apparatus 8, and when the user directs the computer 410 the start of the performance examination to the RFID tag T1 through a predetermined operation, it proceeds to the next step (step S402).

In step S402, it is judged whether the frequency of the electric signal set in the reader writer 20 is the maximum set value (1040 MHz in the present embodiment) now. However, a set value of the frequency is not the maximum set value (No judgment in step S402) immediately after the initialization processing in step S401, and thus process advances to the processing of the next step S403.

In the processing of step S403, as a set value of the frequency in the reader writer 20, there is computed a value in which only a predetermined pitch increment (30 MHz in the present embodiment) is added to a present set value, and there is sent to the reader writer 20 command C11 that sets the computed result to the frequency of the electric signal supplied to the strip line cell 100.

Subsequently, it is judged whether the electric power of the electric signal set in the reader writer 20 is the maximum set value (25.5 dBm in the present embodiment) now (step S404). However, it advances to the processing of the next step S405 because a set value of the electric power is not the maximum set value (No judgment in step S404) immediately after the initialization processing in step S401.

In the processing of step S405, as a set value of the electric power in the reader writer 20, there is computed a value in which only a predetermined increment (0.5 dB in the present embodiment) is added to a present set value, and there is sent to the reader writer 20 command C12 that sets the computed result to the electric power of the electric signal supplied to the strip line cell 100.

Next, when the electric power and the frequency are set by the processing of step S403 and step S405, command C13 that directs the effect to supply the demand signal to demand UID from RFID tag T1 to be examined to the strip line cell 100 is sent to the reader writer 20 (step S406).

Processing that is a combination of the processing of step S404, the processing of step S403, and the processing of step S405 corresponds to one example of the supply process referred to in the present invention.

The reader writer 20 supplies the demand signal that has the frequency and the electric power set as mentioned above to strip line cell 100. And, when the RFID tag T1 outputs the response signal S11 representative of UID for the demand signal, the reader writer 20 receives the response signal S11 through the strip line cell 100 and sends it to the computer 410.

On the other hand, the computer 410 shifts to the stand-by state of predetermined time after step S404 (step S407). And, it is judged whether the response signal S11 is sent by the reader writer 20 after the predetermined time passes (step S408). Processing that is a combination of the processing of step S408 and the processing of step S407 corresponds to one example of the reaction confirmation process referred to in the present invention. When the response signal S11 is not sent by the reader writer 20 (No judgment in step S408), it returns up to step S404, and processing from step S404 to step S408 is repeated. This repetition is kept till a set value of the electric power reaches the maximum set value (Yes judgment in step S404) or the response signal S11 is sent by the reader writer 20 (Yes judgment in step S407).

When the response signal S11 is sent by the reader writer 20, the computer 410 converts a set value of the electric power at that time into the communication limit distance by using the relation of electric power vs. distance mentioned above (step S409).

In processing of step S407, when such a communication limit distance of RFID tag T1 to be examined is determined, the computer 410 associates the communication limit distance with the frequency at that time and UID that is represented by the response signal S11 from the RFID tag T1 and the computer 410 preserves it in a predetermined memory (step S410). Subsequently, a set value of the electric power is initialized (step S411), and processing returns up to step S402.

When the processing returns up to step S402, the processing from step S402 to step S410 is repeated afterwards, so that there is determined the communication limit distance of a frequency in which only the above-mentioned pitch increment (30 MHz) is added to the frequency when the communication limit distance is previously determined. Such processing is continued till a set value of the frequency reaches the maximum set value (1040 MHz) (Yes judgment in step S402).

When a set value of the frequency reaches the maximum set value (1040 MHz), the processing returns up to step S401 and the execution of initialization is directed to the reader writer 20 about both the electric power and the frequency, and then it becomes the stand-by state of the performance examination to the following RFID tag.

Thus, according to the processing as explained above, there is determined the communication limit distance of each frequency of 30 MHz pitch that ranges from 800 MHz to 1040 MHz, and the frequency characteristic of the RFID tag is obtained.

Figure 34:
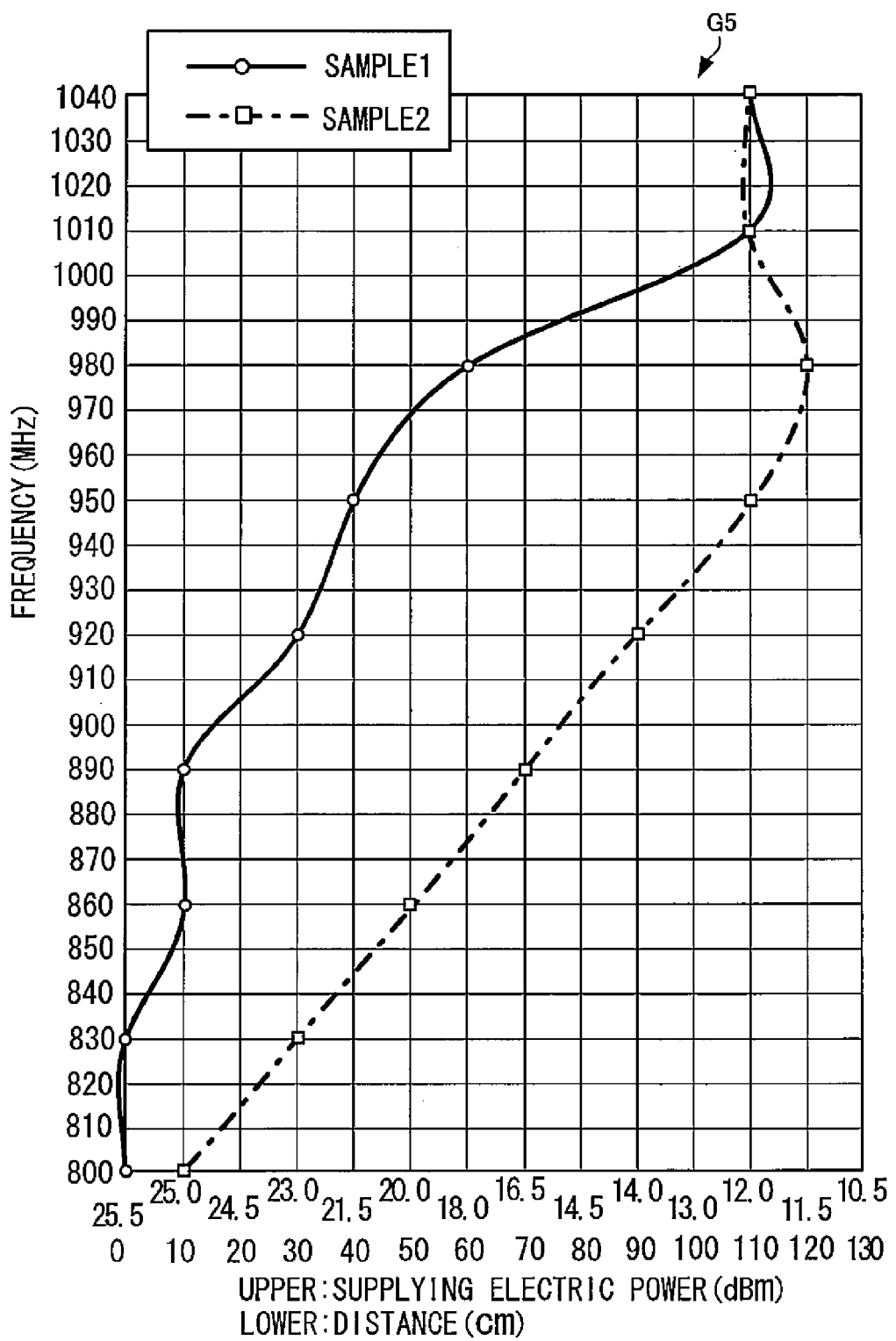
FIG. 34 is a graph of one example of frequency characteristics acquired by frequency characteristics acquisition processing of the flowchart of FIG. 33.

FIG. 34 is a graph of one example of frequency characteristics acquired by frequency characteristics acquisition processing of the flowchart of FIG. 33.

In graph G5 of FIG. 34, a vertical axis denotes a frequency, and a horizontal axis denote the electric power and the communication limit distance. And, in the graph G1, the frequency characteristic acquired about each two samples of the RFID tag is plotted in a diamond point about sample 1, and plotted in a quadrangle point about sample 2 by the frequency characteristic acquisition processing.

According to graph G5 of FIG. 34, the communication limit distance to the frequency of 1020 MHz is the longest in sample 1 and the gain is maximum. Moreover, the communication limit distance to the frequency of 980 MHz is the longest in sample 2 and the gain is the maximum.

According to the present embodiment, both of the communication frequency assumed to the RFID tag are 953 MHz. However, as mentioned above, the frequency of the radio wave signal sent and received with the RFID tag might be changed by the influence of the used environment such as relative permittivity of the object that exists on the propagation path such as the covers of the article and the RFID tag in which the RFID tag is installed. Then, the RFID tag to which the influence of such a used environment is expected is designed in such a manner that the frequency to obtain the maximum gain is shifted from 953 MHz so as to obtain the maximum gain for the communication frequency of 953 MHz when it is put under such a used environment.

As for the above-mentioned two samples, the use under the environment with the influence for the radio wave signal is assumed, and both samples are designed in such a manner that frequencies to obtain the maximum gain are shifted from 953 MHz. Moreover, because the assumed used environments of the sample 1 and the sample 2 are different from one another, the discrepancy from 953 MHz of the frequency to obtain the maximum gain when designing is mutually different between these samples.

The reason why the frequency to obtain the maximum gain is shifted from the assumed communication frequency 953 MHz in the frequency characteristic measured on each sample illustrated in graph G5 of FIG. 34, and in addition the frequencies to obtain the maximum gain are mutually different among both is that the samples are designed as mentioned above taking the used environments into consideration.

When RFID tag is actually manufactured, it is judged whether a frequency to obtain the maximum gain and the communication limit distance in the frequency, which are read from the frequency characteristic of each RFID tag, fill the judging standard based on the design that takes the used environments into consideration, and thus there is discriminated between the quality item and defective goods.

According to the RFID tag test apparatus 8 of the present embodiment, it is possible to acquire the frequency characteristic of each various kinds of RFID tag designed corresponding to each various used environments. And, the user judges whether the above-mentioned characteristic value, which can be read from the acquired each frequency characteristic, fills the judging standard corresponding to each used environment, so that the quality selection is done.

As explained referring to FIG. 31 to FIG. 34, according to the present embodiment, it is possible to obtain easily and enough the frequency characteristic of the RFID tag corresponding to each various used environments without using a special environment such as the RF anechoic chambers, so that the quality selection corresponding to each used environments can be done.

Next, there will be explained a ninth embodiment of the present invention.

Figure 35:
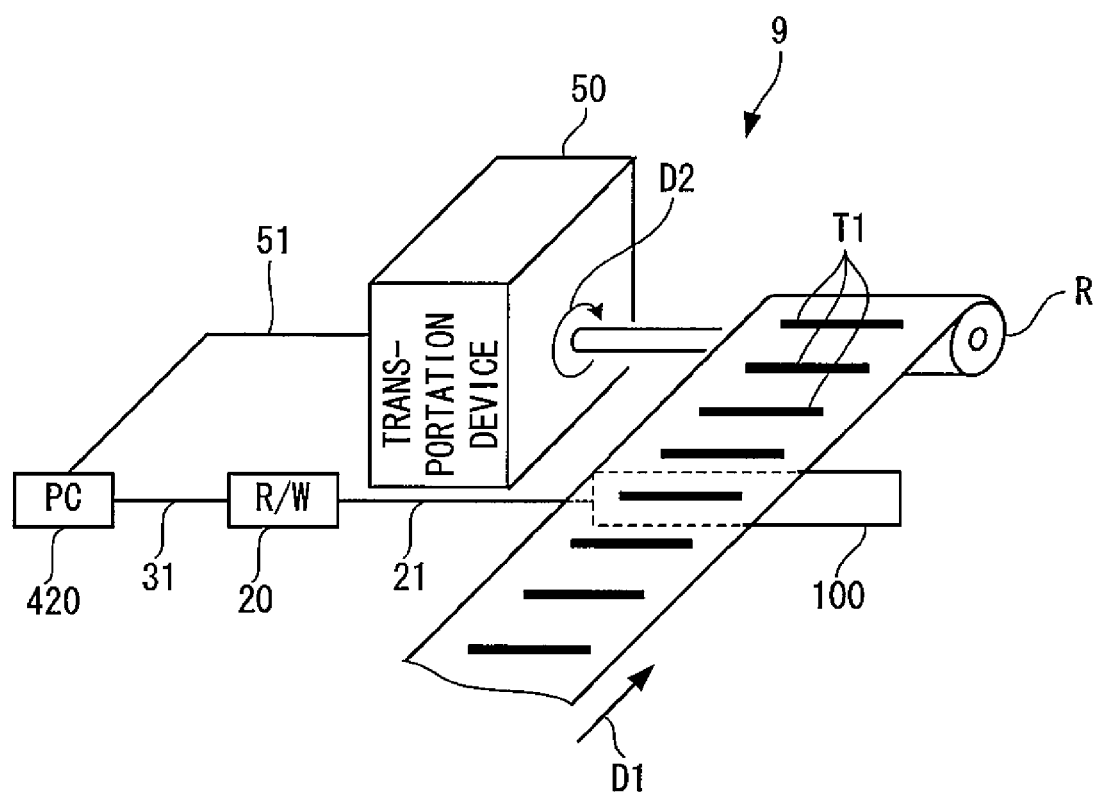
FIG. 35 is a view useful for understanding an RFID tag test apparatus according to a ninth embodiment of the present invention.

FIG. 35 is a view useful for understanding an RFID tag test apparatus according to a ninth embodiment of the present invention.

RFID tag test apparatus 9 of FIG. 35 is equal to the RFID tag test apparatus 2 in the second embodiment of FIG. 17 excepting the point that the RFID tag test apparatus 9 of FIG. 35 is an apparatus for obtaining the frequency characteristic defined as the association between the frequency of the radio wave signal and the communication limit distance. Therefore, in FIG. 35, regarding components equal to those of FIG. 17, the same reference numbers as FIG. 17 are fixed, and, in the following, the repetition explanation of these components will be omitted.

According to the RFID tag test apparatus 9, there are sequentially acquired the frequency characteristics on two or more RFID tags T1 of the tag role R, which are sequentially transported to the strip line cell 100 by the transportation device 50. The frequency characteristic acquisition processing in the RFID tag test apparatus 9 is implemented in such a manner that the computer 420 controls the reader writer 20 along the flow of the processing which will be explained later. The computer 420 also corresponds to one example of the reaction confirmation section referring to the present invention.

FIG. 36 is a flowchart useful for understanding a flow of the frequency characteristics acquisition processing to be executed with the RFID tag test apparatus 9. The frequency characteristics acquisition processing according to the flowchart of FIG. 36 is almost equal to the processing according to the flowchart of FIG. 33 excluding the point that it has processing (step S501) that sends the command that directs the transportation device 50 transportation. Therefore, in FIG. 36, regarding processing process equal to the processing processes in the flowchart of FIG. 33, the same reference numbers as FIG. 33 are fixed, and, in the following, the repetition explanation of these processing processes will be omitted.

While the initialization processing (step S401) of FIG. 33 is processing that becomes a stand-by state after giving the instruction of initialization to the reader writer, initialization processing (Step S401') of FIG. 36 is one that omits such a stand-by state and advances processing to the following processing. Moreover, while the processing of step S402 of FIG. 33 is processing that returns to initialization processing (step S401) when the frequency reaches the maximum set value, the processing of the step S402' following Step S401' is processing that that does not return to initialization processing (step S401') and advances to the processing of step S501 which will be explained as follows.

Processing of step S501 is executed when a set value of the frequency of the RFID tag T1, which is located at the position of strip line cell 100, reaches the maximum set value (Yes judgment of step S402'), that is, when the acquisition of the frequency characteristic on the RFID tag T1 ends. In processing of the step S501, the computer 420 sends to the transportation device 50 command C14 that directs to rotate around a center axis of the tag role R by the angle that corresponds to the transportation for the arrangement interval. When the transportation device 50 operates in accordance with the command C14, RFID tag T1 of the un-acquisition comes to replace RFID tag T1 of the frequency characteristic acquisition and to be arranged at the position of strip line cell 100.

As mentioned above, according to the ninth embodiment explained referring to FIG. 35 and FIG. 36, it is possible to efficiently acquire the frequency characteristics on two or more RFID tags T1, and in addition it is possible to manufacture efficiently two or more RFID tags T1.

Incidentally, in the embodiment as mentioned above, as one example of the conversion relation referred to in the present invention, the relation of electric power vs. distance is illustrated. However, the present invention is not restricted to such an embodiment. It is acceptable that the conversion relation referred to in the present invention is a set of the relation of distance vs. electric field strength and the relation of electric power vs. electric field strength, which is used to make the relation of the electric power vs. distance for instance. In this case, the electric power is converted into the distance by comparing these two relations with one another. Moreover, the conversion relation referring to in the present invention may be a computation formula in which the distance is determined from the electric power, or a set of a computation formula in which electric field strength is determined from the distance and a computation formula in which electric field strength is determined from the electric power, but not the relation based on such a measurement.

Moreover, according to the embodiment as mentioned above, as one example of the strip line cell referred to in the present invention, there is disclosed the strip line cell in which the interval of two conductor boards is ⅕ of the width of one conductor board, and the length is about ½ wavelength of the electric wave of 953 MHz. However, the present invention is not restricted to the embodiment, and it is acceptable that the strip line cell referred to in the present invention is one in which the interval of two conductor boards is other than ⅕ of the width of one conductor board, and the length is other than about ½ wavelength of the electric wave of 953 MHz.

Moreover, according to the embodiment as mentioned above, as one example of the putting board referred to in the present invention, there is disclosed the putting board 109 made of the acrylic fiber. However, the present invention is not restricted to the embodiment, and it is acceptable that the putting board referred to in the present invention is ones made of the styrene foam, for instance.

Moreover, according to the embodiment as mentioned above, there is disclosed an example in which one reader writer is provided with two strip line cells 100. However, the present invention is not restricted to the embodiment, and it is acceptable that one reader writer is provided with three or more strip line cells 100, for instance.

Moreover, according to the embodiment as mentioned above, there is disclosed an example in which there are provided two pieces of reader writer. However, the present invention is not restricted to the embodiment, and it is acceptable that there are provided three or more pieces of reader writer.

Moreover, according to the embodiment as mentioned above, as one example of the FIFO memory referred to in the present invention, there is disclosed a three-stage of FIFO memory in number of buffer stage. However, the present invention is not restricted to the embodiment, and it is acceptable that the FIFO memory referred to in the present invention is FIFO memory having other than three stages in number of buffer stage.

What is claimed is:

1. A test apparatus comprising:
a strip line cell that includes a first conductor board which has the width greater than the width of an electronic device receiving a predetermined radio wave signal to react, to which first conductor board an electric signal corresponding to the radio wave signal is supplied from outside, and a second conductor board being opposed to the first conductor board and serving as a ground, wherein the electronic device is arranged on other side with respect to an opposite surface of the first conductor board, the opposite surface being opposed to the second conductor board, and that transmits the radio wave signal in an output according to an electric power which the electric signal has;
a supplying section that supplies the electric signal to the first conductor board of the strip line cell; and
a reaction confirmation section that confirms whether or not there is a reaction in the electronic device.

2. The test apparatus according to claim 1, further comprising:
a conversion section that converts an electric power which the electric signal supplied to the strip line cell by the supplying section has into a distance between a predetermined antenna and the electronic device in a situation in which the predetermined antenna sends the radio wave signal in a predetermined output for the electronic device to receive, in accordance with a predetermined conversion relation.

3. The test apparatus according to claim 1, wherein the supplying section sequentially supplies electric signals each having respective electric powers being different to one another to the strip line cell, and
the reaction confirmation section confirms a reaction of the electronic device for each of the electric signals.

4. The test apparatus according to claim 1, wherein the supplying section sequentially supplies electric signals each having an electric power in a predetermined range of electric power to the strip line cell,
the reaction confirmation section confirms a reaction of the electronic device to each of the electric signals, and
the test apparatus further comprises a transportation section that transports a plurality of the electronic devices to arrange sequentially the plurality of the devices for the strip line cell, and that arranges, in a case where one arranged electronic device reacts while the electric signals are sequentially supplied to the one arranged electronic device, or in a case where the electric signals are supplied until the last, one following electronic device.

5. The test apparatus according to claim 1, wherein the strip line cell transmits the radio wave signal of same frequency as that of the electric signal,
the supplying section performs a process to supply sequentially electric signals each having a mutually different electric power to the strip line cell for each frequency in a predetermined frequency range, and
the reaction confirmation section confirms a reaction of the electronic device to each of the electric signals.

6. The test apparatus according to claim 1, wherein the strip line cell transmits the radio wave signal of same frequency as that of the electric signal,
the supplying section performs a process to supply sequentially electric signals each having an electric power in a predetermined electric power range to the strip line cell for each frequency in a predetermined frequency range,
the reaction confirmation section confirms a reaction of the electronic device to each of the electric signals, and
the test apparatus further comprises a transportation section that transports a plurality of the electronic devices to arrange sequentially the plurality of electronic devices for the strip line cell, and arranges, in a case where the process to supply each of the electric signals is performed for one arranged electronic device until the last frequency of the frequency range, one following electronic device.

7. The test apparatus according to claim 1, wherein the test apparatus has a plurality of the strip line cells for each of which the electronic device is arranged, and the supplying section supplies the electric signals to the plurality of the strip line cells in mutually different timings, respectively.

8. The test apparatus according to claim 1, wherein the test apparatus has a plurality of sets each including of a plurality of the strip line cells for each of which the electronic device is arranged, and the supplying section has a plurality of suppliers each associated with the plurality of sets, respectively, and each of the plurality of suppliers supplies the electric signal to each of the plurality of the strip line cells composing each of the plurality of sets in respective timings being different to one another.

9. The test apparatus according to claim 1, wherein the electronic device outputs identification information identifying oneself from other electronic devices when the electronic device receives a first radio wave signal, and performs the reaction to be confirmed by the reaction confirmation section when the electronic device receives a second radio wave signal containing the identification information of the oneself, the test apparatus further comprises:
two of the strip line cells, the two of the strip line cells being disposed in a predetermined interval, for each of which two of the strip line cells the electronic device is arranged;
an identification information obtaining section that obtains the identification information which the electronic device outputs, and
a transportation section that transports the electronic device by the predetermined interval along an arrangement of the two of the strip line cells to arrange the electronic device sequentially for the two of the strip line cells, and
the supplying section supplies a first electric signal corresponding to the first radio wave signal to a first strip line cell for which the electronic device is first arranged of the two of the strip line cells, and supplies a second electric signal corresponding to the second radio wave signal containing the identification information obtained by the identification information obtaining section about the first radio wave signal, to a second strip line cell for which the electronic device is later arranged of the two of the strip line cells, in a timing when the electronic device identified by the identification information is arranged for the second strip line cell.

10. The test apparatus according to claim 9, wherein the transportation section performs transportation, instead of the transportation by the predetermined interval, by an interval corresponding to one an integral submultiple of the predetermined interval, to arrange the electronic devices are sequentially for the two of the strip line cells, the identification information obtaining section has a FIFO memory which stores, by First-In First-Out method, information of the same number as a number of times of the transportation for moving the electronic device from one to other of the two strip line cells by the transportation section, and stores the identification information output from the electronic device in the FIFO memory whenever the supplying section supplies the first electric signal to the first strip line cell, and the supplying section sequentially repeats supplying of the first electric signal, obtaining the information from the FIFO memory, and supplying of the second electric signal based on the obtained information.

11. The test apparatus according to claim 1, wherein the electronic device outputs identification information identifying oneself from the other electronic devices when the electronic device receives a first radio wave signal, and performs the reaction to be confirmed by the reaction confirmation section when the electronic device receives a second radio wave signal containing the identification information of the electronic device itself, the test apparatus further comprises:
two of the strip line cells, for each of which two of the strip line cells the electronic device is arranged; and
an identification information obtaining section that obtains identification information which the electronic device outputs,
a transportation section that arranges the electronic device to each of the two of the strip line cells, and
an attenuation section that attenuates at a predetermined level the electric signal to be supplied to a first strip line cell which is one of the two of the strip line cells, and transfers the attenuated electric signal to a second strip line cell which is another of the two of the strip line cells, and
the supplying section supplies a first electric signal corresponding to the first radio wave signal to the first strip line cell, and supplies a second electric signal corresponding to the second radio wave signal containing the identification information obtained by the identification information obtaining section through the first strip line cell and the attenuation section to a second strip line cell.

12. The test apparatus according to claim 1, further comprising a transmission section that is interposed between the supplying section and the strip line cell, that converts an electric power of the electric signal which the supplying section supplies into an electric power according to a predetermined operation, and that transmits the electric signal after the electric power conversion to the strip line cell.

13. The test apparatus according to claim 12, wherein the transmission section has a plurality of scales representing a mutually different distances, the plurality of scales each representing of a distance between a predetermined antenna and the electronic device in a situation where the predetermined antenna transmits the radio wave signal in a predetermined output to be received by the electronic device, and when a predetermined operator is set to either one of the plurality of scales, converts the electric power of the electric signal which the supplying section supplies, in the situation, into an electric power necessary for the strip line cell to transmit the radio wave signal of an output equal with the output of the radio wave signal in the distance represented by the set scale.

14. The test apparatus according to claim 12, wherein the test apparatus has two of the strip line cells, the transmission section transmits the electric signal to a first strip line cell which is one of the two of the strip line cells, and
the test apparatus further comprises a second transmission section that attenuates the electric signal transmitted to the first strip line cell to a level according to a predetermined operation, and transmits the attenuated electric signal to a second strip line cell which is another of the two of the strip line cells.

15. The test apparatus according to claim 1, wherein the strip line cell is a strip line cell in which a distance between the first conductor board and the second conductor board is of $\frac{1}{5}$ or less of the width of the first conductor board.

16. The test apparatus according to claim 1, wherein the strip line cell is a strip line cell which has, as the first conductor board, a conductor board with a half or less length of a wavelength of the radio wave signal.

17. The test apparatus according to claim 1, wherein the strip line cell has a putting board that is shaped as a board where the radio wave signal penetrates, in which the electronic device is put on one surface of front and back surfaces of the putting board, and other surface with respect to the one surface comes in contact with the first conductor board.

18. The test apparatus according to claim 1, wherein the strip line cell has a cover section that covers other side with respect to the opposite surface of the first conductor board excluding a predetermined area to limit an amount and a direction of the electric wave transmitted from the first conductor board to a predetermined amount and a predetermined direction, respectively.

19. A test method comprising the steps of:
supplying an electric signal to a first conductor board of a strip line cell that includes a first conductor board which has the width greater than the width of an electronic device receiving a predetermined radio wave signal to react, to which first conductor board an electric signal corresponding to the radio wave signal is supplied from outside, and a second conductor board being opposed to the first conductor board and serving as a ground, wherein the electronic device is arranged on other side with respect to an opposite surface of the first conductor board, the opposite surface being opposed to the second conductor board, and that transmits the radio wave signal in an output according to an electric power which the electric signal has; and
confirming whether or not there is a reaction in the electronic device.

20. A manufacturing method comprising the steps of:
creating an electronic device that receives a predetermined radio wave signal to react; and
testing including the steps of:
supplying an electric signal to a first conductor board of a strip line cell that includes a first conductor board which has the width greater than the width of an electronic device, to which first conductor board an electric signal corresponding to the radio wave signal is supplied from outside, and a second conductor board being opposed to the first conductor board and serving as a ground, wherein the electronic device is arranged on other side with respect to an opposite surface of the first conductor board, the opposite surface being opposed to the second conductor board, and that transmits the radio wave signal in an output according to an electric power which the electric signal has; and
confirming whether or not there is a reaction in the electronic device.

* * * * *